(12) United States Patent
Estakhri et al.

(10) Patent No.: US 7,155,559 B1
(45) Date of Patent: Dec. 26, 2006

(54) FLASH MEMORY ARCHITECTURE WITH SEPARATE STORAGE OF OVERHEAD AND USER DATA

(75) Inventors: Petro Estakhri, Pleasanton, CA (US); Siamack Nemazie, San Jose, CA (US)

(73) Assignee: Lexar Media, Inc., Fremont, CA (US)

( * ) Notice: Subject to any disclaimer, the term of this patent is extended or adjusted under 35 U.S.C. 154(b) by 615 days.

(21) Appl. No.: 09/648,271

(22) Filed: Aug. 25, 2000

(51) Int. Cl.
G06F 12/02 (2006.01)

(52) U.S. Cl. .................... 711/103; 365/185.33

(58) Field of Classification Search ............ 711/103, 711/202–203, 209, 221; 365/185.33, 94, 365/230.03, 185.09, 230.09; 714/6, 746, 714/766, 768
See application file for complete search history.

(56) References Cited

U.S. PATENT DOCUMENTS

| | | | |
|---|---|---|---|
| 4,498,146 A | 2/1985 | Martinez | 364/900 |
| 4,507,693 A | 3/1985 | Matsuda et al. | 360/72.2 |
| 4,907,162 A | 3/1990 | Fougere | 364/464.02 |
| 4,979,173 A | 12/1990 | Geldman et al. | 371/39.1 |
| 5,140,595 A | 8/1992 | Geldman et al. | 371/39.1 |
| 5,172,381 A | 12/1992 | Karp et al. | 371/42 |
| 5,200,959 A | 4/1993 | Gross et al. | 371/21.6 |
| 5,235,585 A | 8/1993 | Bish et al. | 369/54 |
| 5,255,136 A | 10/1993 | Machado et al. | 360/77.02 |
| 5,270,979 A | 12/1993 | Harari et al. | 365/218 |
| 5,271,018 A | 12/1993 | Chan | 371/10.2 |
| 5,283,882 A | 2/1994 | Smith et al. | 395/425 |
| 5,303,198 A | 4/1994 | Adachi et al. | 365/218 |
| 5,317,505 A | 5/1994 | Karabed et al. | 364/410 |
| 5,337,275 A | 8/1994 | Garner | 365/189.01 |
| 5,341,330 A | 8/1994 | Wells et al. | 365/185 |
| 5,341,339 A | 8/1994 | Wells | 365/218 |
| 5,357,475 A | 10/1994 | Hasbun et al. | 365/218 |
| 5,388,083 A | 2/1995 | Assar et al. | 365/218 |
| 5,430,859 A | 7/1995 | Norman et al. | 395/425 |
| 5,455,721 A | 10/1995 | Nemazie et al. | 360/51 |
| 5,465,235 A | 11/1995 | Miyamoto | 365/203 |
| 5,477,103 A | 12/1995 | Romano et al. | 318/601 |
| 5,479,638 A | 12/1995 | Assar et al. | 395/430 |
| 5,485,595 A | 1/1996 | Assar et al. | 395/430 |
| 5,500,848 A | 3/1996 | Best et al. | 369/275.3 |
| 5,523,724 A | 6/1996 | Assar et al. | 331/1 A |
| 5,523,903 A | 6/1996 | Hetzler et al. | 360/77.08 |
| 5,523,979 A | 6/1996 | Nemazie | 365/230.05 |
| 5,524,230 A | 6/1996 | Sakaue et al. | 395/430 |
| 5,544,356 A | 8/1996 | Robinson et al. | 395/600 |
| 5,566,314 A | 10/1996 | DeMarco et al. | 395/430 |
| 5,576,910 A | 11/1996 | Romano et al. | 360/77.08 |
| 5,579,502 A | 11/1996 | Konishi et al. | 395/430 |

(Continued)

FOREIGN PATENT DOCUMENTS

JP  5-46461  2/1993

(Continued)

*Primary Examiner*—Denise Tran
(74) *Attorney, Agent, or Firm*—Haverstock & Owens LLP

(57) ABSTRACT

A flash memory system segregates overhead data from user data so that overhead data may be addressed, programmed and erased independently from user data. The non-volatile memory medium of a flash memory system is mapped into a plurality of separately addressable memory blocks that are independently programmable and independently erasable, including a plurality of Dedicated Overhead Blocks and Dedicated Data Blocks. The Dedicated Overhead Blocks are mapped according to a plurality of distinguishably addressable segments, and include a first Dedicated Overhead Block and a second Dedicated Overhead Block. User Data defined by a VLBA is stored in a Dedicated Data Block within the flash memory.

49 Claims, 21 Drawing Sheets

U.S. PATENT DOCUMENTS

| | | | |
|---|---|---|---|
| 5,581,723 A | 12/1996 | Hasbun et al. | 395/430 |
| 5,586,306 A | 12/1996 | Romano et al. | 395/500 |
| 5,596,526 A | 1/1997 | Assar et al. | 365/185.17 |
| 5,604,880 A | 2/1997 | Dipert | 395/430 |
| 5,606,660 A | 2/1997 | Estakhri et al. | 395/183.14 |
| 5,630,093 A | 5/1997 | Holzhammer et al. | 395/442 |
| 5,678,056 A | 10/1997 | Nakamura | 395/800 |
| 5,696,775 A | 12/1997 | Nemazie et al. | 371/51.1 |
| 5,715,423 A | 2/1998 | Levy | 395/430 |
| 5,737,742 A | 4/1998 | Achiwa et al. | 711/103 |
| 5,740,358 A | 4/1998 | Geldman et al. | 395/184.01 |
| 5,768,043 A | 6/1998 | Nemazie et al. | 360/77.08 |
| 5,818,350 A | 10/1998 | Estakhri et al. | 340/825.52 |
| 5,818,781 A | 10/1998 | Estakhri et al. | 365/226 |
| 5,822,245 A | 10/1998 | Gupta et al. | 365/185.12 |
| 5,835,935 A | 11/1998 | Estakhri et al. | 711/103 |
| 5,838,614 A | 11/1998 | Estakhri et al. | 365/185.11 |
| 5,845,313 A | 12/1998 | Estakhri et al. | 711/103 |
| 5,848,438 A | 12/1998 | Nemazie et al. | 711/201 |
| 5,864,568 A | 1/1999 | Nemazie | 371/40.14 |
| 5,867,428 A | 2/1999 | Ishii et al. | 365/185.24 |
| 5,877,975 A | 3/1999 | Jigour et al. | 365/52 |
| 5,889,959 A | 3/1999 | Whittaker et al. | 395/200.62 |
| 5,905,993 A | 5/1999 | Shinohara | 711/103 |
| 5,907,856 A | 5/1999 | Estakhri et al. | 711/103 |
| 5,909,596 A | 6/1999 | Mizuta | 710/63 |
| 5,920,731 A | 7/1999 | Pletl et al. | 395/834 |
| 5,922,055 A | 7/1999 | Shahar et al. | 710/16 |
| 5,924,113 A | 7/1999 | Estakhri et al. | 711/103 |
| 5,928,347 A | 7/1999 | Jones | 710/129 |
| 5,928,370 A | 7/1999 | Asnaashari | 714/48 |
| 5,930,815 A | 7/1999 | Estakhri et al. | 711/103 |
| 5,946,714 A | 8/1999 | Miyauchi | 711/205 |
| 5,953,737 A | 9/1999 | Estakhri et al. | 711/103 |
| 5,966,720 A | 10/1999 | Itoh et al. | 711/1 |
| 6,018,265 A | 1/2000 | Keshtbod | 327/540 |
| 6,025,966 A | 2/2000 | Nemazie et al. | 360/53 |
| 6,026,293 A | 2/2000 | Osborn | 455/411 |
| 6,034,897 A | 3/2000 | Estakhri et al. | 365/185.33 |
| 6,040,997 A | 3/2000 | Estakhri | 365/185.33 |
| 6,041,001 A * | 3/2000 | Estakhri | 365/200 |
| 6,073,205 A | 6/2000 | Thomson | 711/100 |
| 6,076,137 A | 6/2000 | Asnaashari | 711/103 |
| 6,081,878 A * | 6/2000 | Estakhri et al. | 711/168 |
| 6,084,483 A | 7/2000 | Keshtbod | 331/57 |
| 6,115,785 A | 9/2000 | Estakhri et al. | 711/103 |
| 6,122,195 A | 9/2000 | Estakhri et al. | 365/185.11 |
| 6,125,435 A | 9/2000 | Estakhri et al. | 711/201 |
| 6,128,695 A | 10/2000 | Estakhri et al. | 711/103 |
| 6,134,151 A | 10/2000 | Estakhri et al. | 365/185.33 |
| 6,138,180 A | 10/2000 | Zegelin | 710/11 |
| 6,141,249 A | 10/2000 | Estakhri et al. | 365/185.11 |
| 6,144,607 A | 11/2000 | Sassa | 365/230.03 |
| 6,145,051 A | 11/2000 | Estakhri et al. | 711/103 |
| 6,151,247 A | 11/2000 | Estakhri et al. | 365/185.11 |
| 6,157,559 A | 12/2000 | Yoo | 365/52 |
| 6,172,906 B1 | 1/2001 | Estakhri et al. | 365/185.11 |
| 6,173,314 B1 | 1/2001 | Kurashima et al. | 709/204 |
| 6,182,162 B1 | 1/2001 | Estakhri et al. | 710/11 |
| 6,202,138 B1 | 3/2001 | Estakhri et al. | 711/168 |
| 6,223,308 B1 | 4/2001 | Estakhri et al. | 714/42 |
| 6,230,234 B1 | 5/2001 | Estakhri et al. | 711/103 |
| 6,262,918 B1 | 7/2001 | Estakhri et al. | 365/185.33 |
| 6,282,624 B1 * | 8/2001 | Kimura et al. | 711/202 |
| 6,314,480 B1 | 11/2001 | Nemazie et al. | 710/74 |
| 6,327,639 B1 | 12/2001 | Asnaashari | 711/103 |
| 6,339,831 B1 | 1/2002 | Sugawara et al. | 714/3 |
| 6,360,220 B1 | 3/2002 | Forin | 707/8 |
| 6,374,337 B1 | 4/2002 | Estakhri | 711/169 |
| 6,385,667 B1 | 5/2002 | Estakhri et al. | 710/8 |
| 6,393,513 B1 | 5/2002 | Estakhri et al. | 711/103 |
| 6,397,314 B1 | 5/2002 | Estakhri et al. | 711/168 |
| 6,404,246 B1 | 6/2002 | Estakhri et al. | 327/156 |
| 6,411,546 B1 | 6/2002 | Estakhri et al. | 365/185.11 |
| 6,426,893 B1 * | 7/2002 | Conley et al. | 365/185.11 |
| 6,446,177 B1 * | 9/2002 | Tanaka et al. | 711/163 |
| 6,462,986 B1 | 10/2002 | Khan | 365/185.2 |
| 6,484,216 B1 | 11/2002 | Zegelin | 710/11 |
| 6,490,649 B1 | 12/2002 | Sinclair | 711/103 |
| 6,587,382 B1 * | 7/2003 | Estakhri et al. | 365/185.29 |
| 6,603,509 B1 | 8/2003 | Haruki | 348/231 |
| 6,625,713 B1 * | 9/2003 | Iida et al. | 711/206 |
| 6,658,202 B1 | 12/2003 | Battaglia et al. | 386/117 |
| 6,757,783 B1 | 6/2004 | Koh | 711/115 |
| 6,757,842 B1 * | 6/2004 | Harari et al. | 714/7 |
| 6,772,274 B1 * | 8/2004 | Estakhri | 711/103 |

FOREIGN PATENT DOCUMENTS

| | | |
|---|---|---|
| JP | 5-233426 | 9/1993 |
| JP | 5-282883 | 10/1993 |
| JP | 7-122092 | 5/1995 |
| JP | 9-147581 | 6/1997 |
| JP | 10-79197 | 3/1998 |
| WO | WO 98/29890 | 7/1998 |
| WO | WO 99/44113 | 9/1999 |

* cited by examiner

FLASH MEMORY ARCHITECTURE WITH SEPARATE STORAGE OF OVERHEAD AND USER DATA

FIELD OF THE INVENTION

The present invention relates to the field of flash memory systems. More particularly, the present invention relates to a mapping of a flash memory array that segregates data and overhead storage.

BACKGROUND OF THE INVENTION

Flash memory technology is an electrically rewritable nonvolatile digital memory medium. Being non-volatile, it does not require a sustained voltage to retain digital data within its memory. A flash memory cell typically stores charge on a floating gate to represent a first logic state in the binary state system, while the lack of stored charge represents a second logic state in the binary state system. Flash memory cells typically support a write operation, a read operation, and an erase operation. Like traditional rotating storage media, flash memory is non-volatile. Because of this, data stored in it is retained when power is cut off. This makes it particularly useful for a number of applications such as digital photography, where a full piece of digital "film" may be removed from a camera and replaced with a fresh piece. Removing a flash type digital memory system from a host camera will not result in memory loss.

As flash memory technology has evolved, opportunities in a variety of applications have become possible. In particular, flash memory implementations that emulate the mass storage function of conventional rotating magnetic media, e.g., a hard disk drive or a floppy disk drive, coupled to a host computer system or other host digital system have gained wide acceptance. Hard disk drives and floppy disk drives suffer several deficiencies which are not shared by flash memory technology. First, hard disk drives and floppy disk drives have many moving parts, e.g. an electrical motor, a spindle shaft, a read/write head, and a magnetizable rotating disk. These components give rise to reliability problems and magnify the hard disk drive's and floppy disk drive's susceptibility to failure resulting from the vibration and shock of being dropped or bumped. Secondly, a motor driven disk drive consumes a significant amount of power, substantially shortening the operational time between battery chargings. Finally, accessing data stored in the hard disk drive or the floppy disk is a relatively slow process.

In contrast, a flash memory system possesses many advantages over rotating storage disks. The typical flash memory system has no moving parts, accounting for the higher reliability of the typical flash memory system. In addition, the rugged design of the typical flash memory system withstands environmental conditions and physical mishandling that would otherwise be catastrophic to the hard disk drive or the floppy disk drive. Generally, a user can access data stored in the typical flash memory system fairly quickly. Finally, the power consumption of the typical flash memory system is considerably lower than the hard disk drive's and the floppy disk drive's power consumption.

Because of the market saturation and universal application of rotating media such as hard disk drives, any process or device seeking to supplant disk type memory in the market place must be compatible with existing software and operating systems. Although flash memory technology is well suited for mass storage applications, prior art Flash Memory architecture displays both advantages and disadvantages over legacy data storage devices such as hard disk drives or floppy disks. One of the disadvantages commonly found in Flash Memory devices and systems is their inability to replicate data addressing, storage and retrieval procedures implemented by the hard disk drive and the floppy disk drive. Because market compatibility is essential, an apparatus or process for replicating these processes and achieving compatibility with existing operating systems must typically be built into a flash memory system itself. One means of achieving compatibility in the prior art has been to divide flash memory into sectors which are, in size and architecture, similar in storage capacity and architecture to a sector of a traditional hard drive, as will be discussed in greater detail herein.

Another limitation of flash memory technology is the inability to perform a write operation to a sector of a flash memory cell currently storing data. Unlike a disk drive, which typically just writes over a previous storage area, a sector of a flash memory cell must be erased before data storage can occur. This erase requirement interposes a delay between successive write operations on the same sector.

Additionally, a hard disk can erase and rewrite the same sector a virtually unlimited number of times without degrading system performance. In contrast, every time a write and erase cycle occurs to a sector of a flash memory system, the sector's operability is degraded. Voltage levels required to erase a sector of a flash memory cell typically degrade the insulative layer protecting the floating gate. As a result of cumulative erase operations, the insulation will eventually fail, dislodging bound electrons on the floating gate. When the floating gate can no longer effectively retain charge, the flash memory, or some specific sector within a flash memory cell, becomes inoperable. Sophisticated erasure programs can ameliorate the degradation experienced by the erase operation, but have not yet eliminated deleterious effect altogether. Moreover, the loading and running of sophisticated erasure programs is time consuming, adding to the delay that the erase operation itself creates. Failure to employ protective erase programs only accelerates the degradation resulting from erasure, substantially shortening the useful life of a flash memory cell.

Because of this wearing-out property, which makes the typical flash memory cell unusable after a finite number of erase-write cycles, the data storage procedure implemented by the typical flash memory system must address cumulative gate degradation in an attempt to extend the life of a flash memory cell. One way to slow the degradation of a flash memory cell is to reduce the frequency of repeated write and erase operations to the same sector. This has typically been achieved through wear-leveling programs that attempt to regulate sector usage such that different regions of a flash memory cell are erased an equal number of times, thereby wearing-out at a fairly consistent rate. An additional advantage of cycling data storage through successive sectors in a flash memory is the ability to postpone the erasure of a previous sector until an opportune time, thereby avoiding untimely delays that might otherwise attend the erase process.

Therefore, while the data storage procedure implemented by the typical flash memory system represents an improvement over hard and floppy disk storage in terms of moving parts and power consumption, it suffers potential liabilities which must be overcome.

FIG. 1 illustrates an architecture of a flash memory cell according to the prior art. A flash memory array 100 functions as a nonvolatile mass memory component of the typical flash memory device. The flash memory array 100 is divided into a plurality of data blocks 102, . . . , 106 for storing User and Overhead Data. The data blocks 102, . . . , 106 are conventionally labeled from zero to M−1, where M is the total number of data blocks 102, . . . , 106. Usually, each data block 102, . . . , 106 is selectively programmable and erasable. Each data block 102, . . . , 106 is comprised of a plurality of sectors, which will typically emulate a sector of a rotating storage disk, both in terms of capacity, and in terms of many architectural features. Typically, there are sixteen sectors, e.g. 112, . . . , 116 numbered from zero through fifteen, in each data block 102, 104, etc. Because the number of sectors may vary, however, FIG. 1 represents each data block 102, . . . 106 as comprising N sectors, respectively numbered zero through N−1.

Each data block 102, . . . , 106 is defined by a unique Virtual Physical Block Address (VPBA). Assuming for exemplary purposes only that the number of sectors in a physical data block is sixteen, numbered from zero through fifteen, a sector is defined by a Physical Block Address (PBA) comprised of the VPBA of the data block, and the sector number. For example, assume data block 106 were defined according to the Virtual Physical Block Address (VPBA) 1024. Sector fifteen would be defined by the Physical Block Address (PBA) 1024:15.

FIG. 2 illustrates the features of an individual sector 200 according to the prior art. The sector 200 is exemplary of the individual sectors 112, . . . 136 depicted in FIG. 1. A prior art sector 200 typically includes a Data Field 202 for storing User Data, and an Extension Field 204 for storing Overhead Data. Because the Data Field and the Extension Field are part of the same sector according to the prior art, a significant limitation of the prior art has been the inability to erase User Data and Overhead Data independently. Architectural limitations prohibit targeted erasures below the sector level. Accordingly, sub-portions of a sector, such as a Data Field 202 or Extension Field 204 cannot be erased independently.

As noted in conjunction with FIG. 2, the Data Field 202 is typically five hundred twelve bytes, which corresponds with a storage sector length in a commercially available hard disk drive or floppy disk drive. The Extension Field 204 is typically sixteen bytes total, and is comprised of plurality of fields or registers 206, . . . , 212 of varying sizes which contain overhead data. By having both a User Data Field 202 and an Extension Field 204, a Sector 200 of Flash Memory is equipped to emulate a sector of data storage area typically found on a rotating storage media such as a disk drive. A recognized Error Correction Code (ECC) is used to generate ECC data stored within the ECC Field 206. The ECC data within a particular ECC field 206 is used for error checking with respect to the User Data stored within the corresponding Data Field 202 of the same sector. The ECC Field 206 is typically four bytes. An LBA Field 208 is used for storing a Logical Block Address (LBA) or Virtual Logical Block Address (VLBA) associated with data stored in the Data Field 210, and is typically 2 bytes of memory, for correlative purposes, as will be discussed in greater detail herein. A Flag Field 210 is used to store a plurality of flags indicating if a block is defective, if a block is used or unused, and if the data stored in a block is current or obsolete. A flag field is typically one byte. A field of optional spare overhead bits 212 typically comprises the unused memory area within the extension field 204.

FIG. 3 illustrates a data storage process within a flash memory system according to the prior art. A host digital system sends User Data 300 defined according to Virtual Logical Block Address seventeen to a flash memory system for storage. The Virtual Logical Block Address is typically assigned by the host. A Virtual Logical Block of User Data 300 is divided up into component logical blocks of data 310, . . . , 316, each comprising distinct addresses 302, . . . , 308. Each logical block 310, . . . , 316 typically holds an amount of User Data equivalent to the memory capacity of the User Data area 202 of a sector 200 of flash memory, that is, five hundred twelve bytes. As previously noted, individual sectors 112, . . . , 136 are defined by unique Physical Block Addresses (PBA's).

The amount of memory in a sector defined by a Physical Block Address (PBA) is equivalent to the amount of User Data in a logical block defined by an LBA. A Virtual Logical Block 300 is comprised of multiple Logical Blocks 310, . . . , 316. Ideally, the number of Logical Blocks of data 310, . . . , 316 making up a Virtual Logical Block 300 are equivalent to the number of sectors 322, . . . 328 making up a data block 320. Accordingly, a Physical Block of memory defined by a Virtual Physical Block Address (VPBA) represents an amount of memory equivalent to the amount of data represented by a Virtual Logical Block Address (VLBA) of User Data. One Virtual Logical Block of incoming User Data 300 defined according to a Virtual Logical Block Address, depicted here as address seventeen, is therefore advantageously stored in one Physical Block of flash memory defined according to a Virtual Physical Block Address, depicted here as address one hundred thirty-four.

The reason for storing logical data of one address into physical memory of a different address stems from the difference between flash memory systems and traditional disk-type memories. In a conventional rotating magnetic media, the LBA-to-PBA correlation is static because updated versions of the data are programmed over old versions of the data. It is recalled however that repeated writing and erasing degrades the life of a flash memory, and that wear-leveling programs are typically employed to ensure a substantially even utilization of all physical data storage areas within a flash memory. It will be recalled that a management algorithm typically attempts to cycle through all Physical Data Blocks before returning to the original Physical Data Block, thereby producing an even rate of use or wear among Physical Data Blocks. In contrast, a logical address may be updated or reused without cycling through all other VLBA's first. Accordingly, incoming data defined by a reused Logical Block Address will not typically be stored in the same physical Sector that previously stored the data defined by that LBA. A distinctive characteristic of the data storage algorithm implemented by the typical flash memory system, therefore, lies in the continuously changing relation between the LBA's and the PBA's.

The Virtual Logical Block of data 300 comprised of a collection of Logical Blocks of data 310, . . . , 316 is defined by a common VLBA, in this case "seventeen," and a succession of consecutive Logical Block offsets, numbered zero through fifteen. The Logical Block Addresses are therefore numbered from "17:0" 302 through "17:15" 308. Consecutive sectors 322, . . . , 328 within a Data Block are similarly distinguished by PBA offset, typically numbered zero through fifteen, and a common VPBA, in this case, "one hundred thirty four." The VPBA plus the PBA offset define a unique PBA or Physical Block Address 310, . . . , 316 for each sector. As noted, each Logical Block 310, . . . , 316 represents an amount of data equivalent to a physical Sector 322, . . . , 328.

A 64 meg memory typically comprising 1024 Physical Data Blocks 102, . . . 106 of memory capacity could therefore store 1024 VLB's of data. One thousand twenty four Physical Data Blocks would be defined according to one thousand twenty four Virtual Physical Block Addresses, and one thousand twenty four Virtual Logical Blocks would be defined by one thousand twenty four Virtual Logical Block Addresses. A ten bit register is required to define one thousand twenty four possible addresses. In a 64 meg flash memory system, therefore, a minimum of ten bits are dedicated to defining a Virtual Logical Block Address or a Virtual Physical Block Address. Accordingly, an LBA Field such as the Temporary LBA Register 340 (FIG. 3) can be conceptually divided into two registers, an upper register or VLBA Field 342 and a lower register or LBA Offset Field, 344. The entire Temporary LBA Register 340 is typically two bytes in length, though it could be greater if necessary. As noted, at least ten bits must be dedicated to the VLBA register 342, and at least four bits to the LBA offset register 344. In a two-byte (sixteen bit) register, the remaining two bits may be located according to the architectural preference of the computer engineer.

Because of the constantly changing relationship between LBA's and PBA's, rapid data retrieval is typically aided by a Space Manager 400, as seen in FIG. 4. A space manager 400 typically comprises a volatile RAM memory for maintaining a correlation between a logical block addresses (LBA's) of data and the physical block addresses (PBA's) of the sectors which store the most recent update of a logical block of data. This correlation enables the Host to subsequently retrieve the data according to its Logical Block Address. A preestablished set of VLBA's 460, . . . , 468 available for association with incoming data are consecutively assigned to a series of Correlation Fields 450, . . . , 458. Each Correlation Field includes a PBA Register 408, which is comprised of VPBA register 410 for storing an address of a Physical Data Block and a PBA offset 412. As with the LBA register discussed earlier, the PBA register typically comprises two bytes. Ten bits are required for a 64 meg flash system with 1024 data blocks. Since a data block typically comprises sixteen sectors, four bits are typically required for the PBA offset 412. The remaining two bits making up a two-byte PBA field 408 may be located in either field, or used as architectural concerns allow. In FIG. 1 the total number of physical data blocks in a flash memory was noted to be M, respectively numbered zero through M minus one. FIG. 4 similarly illustrates that there are "M" consecutive logical addresses 460, . . . 468, also numbered zero through M minus one, corresponding to a plurality of Correlation Fields 450, . . . 458 used for storing Virtual Physical Block Addresses. Accordingly, the number of potential VLBA's 460, . . . , 468 within a Space Manager 400 matches the potential number of Physical Block Addresses within a flash memory cell. It is therefore noted that Space Managers 400 typically correlates physical and logical addresses only down to the Physical Data Block level. This is primarily because space managers consume valuable memory, and correlation to a finer level of memory would consume more memory.

As noted, a space manager 400 is typically implemented as a volatile RAM array. Typically, the space manager 400 comprises SRAM cells. However, FRAM cells can be substituted for the SRAM cells. Because of the speed of accessing information stored in an SRAM or DRAM medium, a Space Manager 400 provides rapid correlation data between Logical Block Addresses and Physical Block Addresses.

Each volatile Correlation Field 450, . . . , 458 includes a plurality of Flags, including a Defective Block Flag 420, an Obsolete Data Flag 430, and an Used Block Flag 440. Each Flag 420, 430, 440 typically comprises a single bit capable of depicting a first and second binary state. When a Defective Block Flag 420 is set from a first value to a second value, the flag indicates that the Physical Data Block is defective. A Physical Data Block marked as defective will be passed over for future data storage. When the Used Block Flag 440 is set, it indicates that data is currently stored in the physical address signified by the VPBA stored in the associated VPBA register. If data is stored, it must either be current or obsolete, typically indicated by a first or second binary state respectively of the Obsolete Data Flag 430. The erase operation is normally be used only when data has been obsoleted. If data defined by a Virtual Logical Block Address is updated, the fresh data is stored in a new physical block 102, . . . 106, and the new VPBA is stored in the VPBA register 410 of the proper correlation field 450, . . . , 458. Consecutive sectors in a data block are typically filled one sector at a time in a continuous data storage operation. If a VLB is only partly comprised of data, for example, eight of the sixteen logical blocks containing actual User Data, the controller will nevertheless typically go through the motions of loading all sixteen logical blocks of a VLB into the data area 202 (FIG. 2) of sixteen consecutive sectors of a physical block. If an update of a single logical block within that Virtual Logical Block is subsequently received, it cannot be stored in the original PBA. A new physical block must be selected. No new incoming data will be stored in a Physical Data Block flagged as "used." When the Obsolete Data Flag 430 is set to a second binary state, the data stored in the corresponding physical block is marked as obsolete, and the Physical Data Block is targeted for erasure. Incoming data may then be reassigned to the physical data block.

In practice, when the logical address and associated data are received for the first time, the typical flash memory system utilizes the space manager 400 to search for the data block with an un-set Defective Block Flag 420 and an un-set Used Block Flag 440 for storing the data. After storing the data therein, the Used Block Flag 440 and an equivalent flag in the Flag Field 240 (FIG. 2) are set to a second binary value, indicating that the Physical Data Block is now used for storing data.

A host presents data defined by an LBA or series of LBS's for storage within the flash memory system. The data is stored in a corresponding sector or series of sectors defined according to a PBA or series of PBA's. When the host requests the data for retrieval, the request is again in the form of a logical address. The data is retrieved from a physical local bearing a physical address through a correlation register such as found in the space manager. The storage and retrieval of data through the operation of the space manager 400 is performed through a series of concatenations and masking operations described in the flow chart of FIG. 5. Additionally, the space manager 400 assists the typical flash memory system in executing the erase operation. Some prior art flash memories can perform the erase operation in the background while another operation is being performed. Alternatively, the erase operation can be postponed until all other operations within a flash memory have ceased. Before initiating the erase operation, the typical flash memory system uses the space manager 400 to search for the data blocks having a set Obsolete Data Flag 430 and an un-set Defective Block Flag 420. These data blocks are then targeted for erasure.

Although correlation between logical and physical memory must be maintained, RAM space managers 400 consume valuable memory. One way of minimizing the memory consumption resulting from the presence of a RAM space manager 400 is to limit correlation to larger groups of data, such as correlating Virtual Logical Blocks Addresses to Virtual Physical Block Addresses defining large blocks of physical memory, thereby resulting in fewer correlation registers within the space manager 400. Returning to FIG. 3, if data from sixteen consecutive logical blocks 310, . . . 316 of User Data defined according to sixteen consecutive LBA's 302, . . . , 308 were stored in sixteen physical sectors 322, . . . , 328 defined according to sixteen consecutive PBA's 310, . . . , 316, a default correlation would exist between the lower order address by virtue of the storage arrangement. Through use of such an arrangement, the space manager 400 need only correlate VBLA's to VPBA's, thereby reducing the space manager 400 to ¹⁄₁₆th the size according to an embodiment comprising sixteen sectors per data block.

FIG. 5 is a flow chart describing the data storage process. The process is described in conjunction with the data fields and registers of FIG. 3. In the first step 502, Virtual Logical Block seventeen 300 of User Data (FIG. 3) is received from a Host for storage in a non-volatile Flash Memory Unit. In step 504, the controller moves the first LBA of the new file of User Data 300 into the Temporary LBA Register 340, which is typically a two bit register in 65 meg flash systems. In step 506 the controller selects an unused, non-defective data block for storage, and writes the VPBA of that data block into the VPBA register 352 of the Temporary PBA Register 351. In step 508, the controller masks the higher order bits (the VLBA) 342 of the Temporary LBA Register 340 and concatenates the lower order bits 344 designated as the "sector offset" into the PBA sector offset 354. In step 510, the controller stores the logical block of data 310, . . . , 316 defined by the address in the Temporary LBA Register 340 in the physical sector defined by the address in the PBA Temporary Register 351. In step 512, the controller writes the value found in the VPBA Temporary Register (352) into the correlation register 450, . . . 458 corresponding to the VLBA 460, . . . , 468 found in the Temporary VLBA Register 342.

FIG. 6 discloses a similar process for retrieving data from the flash memory system at the request of the host. According to step 602, the host requests data defined by an LBA. In step 604, the LBA of the request is written in the Temporary LBA Register 340. In step 606, the lower order bits within the LBA Offset 344 are masked, and the higher order bits defining the VLBA 342 are moved into the Temporary VLBA Register 360. In step 608, through the use of the space manager 400, the controller locates the correlation register 450, . . . , 458 corresponding to the address in the temporary VLBA Register 460. In step 610 the controller moves the VPBA 410 of the select correlation register into the upper register 352 of the PBA Temporary Register 351. In step 612 the controller concatenates the LBA sector offset 344 into the PBA sector offset 354. In step 614, the controller retrieves data found in the sector defined according to the address in the PBA Temporary Register 351. In step 616, the controller sends the retrieved data to the host, and defines the data according to the logical address found in the Temporary LBA Register 340.

The sequence of steps described in FIGS. 5 and 6 is intended to illustrate a means of correlating logical and physical addresses to perform data storage and retrieval according to the prior art. Because the specific mechanics of storage could be performed in a number of equivalent ways, the process disclosed in FIGS. 5 and 6 are not intended to represent these specific processes as the only means of data storage and retrieval according to the prior art, nor to limit data storage and retrieval in the present invention. The details are disclosed simply to illustrate one way of performing a data storage process in a manner that preserves a natural correlation between LBA's and PBA's. According to the process as described above, the LBA offset 344 is used as a PBA offset 354 when storing a VLB of data into a Physical Sector.

Due to the volatile nature of the space manager 400, loss of power erases the data stored in a volatile RAM such as that used in the typical Space Manager. However, any data stored in the Space Manager is backed up in the non-volatile memory, typically in the Extension Fields 204 of the various sectors 112, . . . , 136 of the Flash Memory cells. Power loss has no damaging effect on memory stored in non-volatile storage mediums.

Because loss of power typically destroys the contents of a RAM memory, overhead data is typically be loaded from the Extension Field 204 of select sectors into the Space Manager 400 at power up, or upon a reset command. A VLBA 360 stored in the LBA register 208 of an Extension Field 204 establishes a non-volatile correlation between the Virtual Physical Block Address (VPBA) 364 of the sector 322 in which the Extension Field 204 resides, and the Virtual Logical Block Address (VLBA) 360 stored in the LBA register 208. The Flags within the Flag Registers 420, 430, 440 are also typically loaded from the non-volatile memory field 210 (FIG. 2) into the Space Manager 400 during start up, or upon a reset command.

To control the operations of the typical flash memory system, the typical flash memory system further comprises a controller (not shown) coupled to the flash memory device. Since the space manager 400 is an integral part of the operations performed by the typical flash memory system, the space manager 400 is typically designed within the controller, thereby improving system performance. The silicon area necessary for a large addressable storage capacity, however, typically makes it economically unfeasible to form both the controller and the actual flash memory device on the same integrated circuit. As a result, the controller and flash memory device are typically formed on separate integrated circuits. By forming the controller and the flash memory on separate integrated circuits, manufacturing processes can be employed which are more ideally suited for the formation of each of these individual components, more easily satisfying specific parameters and operating requirements.

Although the space manager 400 enables the typical flash memory system to achieve superior performance, this superior performance is attained at a significant cost in silicon area on the integrated circuit on which the controller is formed. Assuming, for exemplary purposes only, a 64 Mega-Bit, flash memory system with 1024 data blocks and sixteen sectors per data block, the exemplary flash memory system would be comprised of 16,384 sectors. As previously noted, if a single VLB 300 is stored in a single data block 320, only 1024 Correlation Fields 450, . . . 458 are needed within the space manager 400. If a single VLB 300 of data were fragmented among multiple data blocks, the space manager 400 would need 16,384 Correlation Fields 450, . . . 458 to keep correlate all the logical and physical addresses.

As previously noted, multiple liabilities inhere from storing overhead data such as error correction data 206 and flags 210 in the same sector 200 as user data 202. On power up, a lengthy and comprehensive evaluation, potentially accessing every sector of the flash memory must be performed to update the space manager. This process is both time consuming and complex. Segregating overhead data into a hand full of data blocks can substantially improve the speed and efficiency with which the space manager is loaded on power up. A second problem stemming from the mixing of User Data and Overhead Data in the same sector deals with gate degradation. As earlier noted, repeated write and erase cycles eventually "wear-out" a flash memory system. When Overhead Data and User Data are in the same sector, they are exposed to an equal number of write/erase cycles. In the prior art, therefore, the error correction data 206 in a given sector 200 is likely to become degraded at the same rate the user data 202 within that sector. Relying on degraded error correction field to monitor and possibly correct User Data is problematic at best. Finally, when overhead data and user data are stored in the same sector, it was not possible to independently program or erase the overhead data were user data. There exists therefore a need for segregating user data and overhead data into independently addressable, programmable and erasable data blocks within a flash memory cell.

There further exists the need for segregating user data from overhead data in a way that utilizes memory in an efficient manner when one Logical Block Addresses repeated more often than other Logical Block Addresses. There further exists a need for segregating overhead data from user data in a way that makes efficient use of memory when Logical Block Addresses are used at an equal rate. There further exists a need for segregating overhead data from user data in a way that makes efficient use of memory when the comparative usage of various Logical Block Addresses is variable or unknown.

SUMMARY OF THE INVENTION

The present invention discloses a flash memory system designed to reduce inefficiencies and liabilities inherent in systems where user data and overhead data such as Error Correction Data are stored in the same sector. The present invention further discloses a method and apparatus for use in a non-volatile storage medium that segregates overhead data from user data, while maintaining a cross reference between the overhead data and user data. The present invention further discloses a method and apparatus for minimizing the amount of memory consumed by dedicated overhead functions. The present invention further discloses a method and apparatus for segregating user data from overhead data in a way that makes efficient use of overhead memory when one Logical Block Addresses repeated more often than other Logical Block Addresses. The present invention further discloses a method and apparatus for segregating overhead data from user data in a way that makes efficient use of overhead memory in when available Logical Block Addresses are used at an equal or substantially equal rate. The present invention further discloses a method and apparatus for segregating user data from overhead data in a way that makes efficient use of overhead memory when the comparative rate of usage of various Logical Block Addresses is variable or unknown.

According to one embodiment of the present invention, a method of storing digital data within a Flash Memory System comprises the steps of mapping a non-volatile memory medium within the Flash Memory System into a plurality of independently addressable, independently programmable and independently erasable memory blocks including a plurality of Dedicated Data Blocks and a plurality of Dedicated Overhead Blocks comprising a first Dedicated Overhead Block and a second Dedicated Overhead Block. Each of the Dedicated Data Blocks is mapped into a plurality of Overhead Pages. The same set of page addresses is used to define the Overhead Pages among each of the Dedicated Overhead Blocks. Each of the Overhead pages is mapped into a plurality of Overhead Segments. The same set of Segment addresses is used for each Overhead Page. Each Overhead Segment comprises a plurality of registers including a Physical Address Register and a flag field. Within a Dedicated Overhead Block, consecutive Overhead Pages addresses are correlated to a respective plurality of consecutive Virtual Logical Block Addresses including a first Logical Block Address correlated to a first Overhead Page address.

User Data defined according to the first Virtual Logical Block Address is received from a Host and stored in a first Dedicated Data Block defined according to a first Virtual Physical Block Address (VPBA). The first VPBA is stored in the address register of the first available segment within the First Overhead Page defined by the first Overhead Page Address. An available Overhead Segment is a segment that is unused, non-defective, and non obsolete. A first available segment is defined as a segment having the lowest segment address of available segments comprising the first page. The Overhead Segments will advantageously comprise an error correction code. In the consolidation process, all current Overhead Segments within the first Dedicated Overhead Block are copied into a second Dedicated Overhead Block. The page number where a segment is stored in the second Dedicated Data Block is identical to the page number where the data had been stored in the first Dedicated Data Block. Current segments of data being moved to the Second Dedicated Data Block are stored in the lowest addressable segment of each of the respective pages.

According to one embodiment of the present invention, a method of data storage within a Flash Memory comprises the steps of mapping a non-volatile memory medium within the Flash Memory System into a plurality of independently addressable, independently programmable and independently erasable memory blocks including a plurality of Dedicated Data Blocks and a plurality of Dedicated Overhead Blocks comprising a first Dedicated Overhead Block and a second Dedicated Overhead Block. Each of the Dedicated Overhead Blocks is mapped into a plurality of consecutively addressed Overhead Segments. The same set of consecutive overhead Segment Addresses is used in each of the Dedicated Overhead Blocks. Each segment comprises a Physical Address Register and a Flag Field. Each Dedicated Data Block is correlated to a group of Virtual Logical Block Addresses, including a first group of VLBA's correlated to the first Dedicated Overhead Block. When User Data defined according to a first VLBA within the first group of VLBA's is received, it is stored in a first Dedicated Data Block defined according to a first Virtual Physical Block Address (VPBA). The first VPBA is stored in the address register of the first available segment within the dedicated Overhead Block. When a Dedicated Overhead Block becomes full, all current Overhead Segments are identified and copied into a new Dedicated Overhead Block, beginning from the lowest addressable segment of the new Dedicated Overhead Block. The old Dedicated Overhead Block is then targeted for erasure.

A method of storing digital data within a Flash Memory System comprises the steps of mapping a non-volatile memory medium within the Flash Memory System into a plurality of separately addressable, separately programmable and separately erasable memory blocks comprising a plurality of Dedicated Data Blocks and a plurality of Dedicated Overhead Blocks, including a first Dedicated Overhead Block and a second Dedicated Overhead Block. Each of the Dedicated Overhead Blocks is mapped into a fixed overhead field and a random overhead field. The fixed overhead field of each of the plurality of Dedicated Overhead Blocks comprises a plurality of consecutively addressable Overhead Segments defined according to an identical sequence of Overhead Segment addresses. The random overhead field of each Dedicated Overhead Block comprises a plurality of consecutively addressable Overhead Segments. Each Overhead Segment comprises a plurality of registers including a Physical Address Register. Consecutive Virtual Logical Block Addresses from a first group of Virtual Logical Block Addresses are correlated to the plurality of consecutively addressed Overhead Segment within the fixed overhead field of the first Dedicated Overhead Block, including a first Fixed Overhead Segment correlated to a first Virtual Logical Block Address.

When data defined according to the first Virtual Logical Block Address is received, it is stored in a first Dedicated Data Block defined by a first Virtual Physical Block Address. Overhead data supporting the first VLBA, including the first VPBA where the actual User Data is stored, is stored in a segment of the first Dedicated Overhead Block. If the first Fixed Overhead Segment is available, the overhead data including the first VPBA is stored therein. If the first Fixed Overhead Segment is not available, the overhead data supporting the first VLBA is stored in the first available Overhead Segment in the Random Field of the first Dedicated Overhead Block. When a Dedicated Overhead Block becomes full, a new Dedicated Overhead Block is identified, and the consecutive Overhead Segment Addresses are correlated to the consecutive Virtual Logical Block Addresses identically to the first Dedicated Overhead Block. All current Overhead Segments are identified, and associated with the VLBA to which they store overhead data. The current Overhead Segments are then copied into a the Fixed Overhead Field into predetermined segments correlated to the VLBA's associated with each particular current Overhead Segment. The old Dedicated Overhead Block is then targeted for erasure.

A method of storing digital data within a Flash Memory System comprises the steps of mapping a non-volatile memory medium within the Flash Memory System into a plurality of separately addressable, separately programmable and separately erasable memory blocks comprising a plurality of Dedicated Data Blocks and a plurality of Dedicated Overhead Blocks, the plurality of Dedicated Overhead Blocks including a first Dedicated Overhead Block and a second Dedicated Overhead Block. Each of the plurality of Dedicated Overhead Blocks are mapped into plurality of Super Overhead Fields, including a first Super Overhead Field within the first Dedicated Overhead Block. Each of the plurality of Super Overhead Fields are mapped into an identical set of consecutively addressable Overhead Segments, each Overhead Segment comprising a plurality of registers including a Physical Address Register. A group of consecutive Virtual Logical Block Addresses within a Super Virtual Logical Block are correlated to consecutive Overhead Segments within the first Super Overhead Field, including a first Virtual Logical Block Addresses correlated to a first Overhead Segment. A first set of User Data defined according to the First Virtual Logical Block Address is received and stored in a first Dedicated Data Block defined according to a first Virtual Physical Block Address. Overhead data, including the first Virtual Physical Block Address is stored in the first Overhead Segment. If the first Super Overhead Field was not the last Super Overhead Field in the first Dedicated Overhead Block, the controller then increments to the next Super Overhead Field within the first Dedicated Overhead Block. If the first Super Overhead Field was the last Super Overhead Field within the first Dedicated Overhead Block, all current Overhead Segments are identified and moved to the same respective segment addresses within the first addressable Super Overhead Field of a new Dedicated Overhead Block.

According to one embodiment of the present invention, a flash memory device for storing User Data comprising a plurality of separate, independently addressable, independently programmable and independently erasable non-volatile Physical Memory Blocks distinguishably defined by a plurality of Physical Block Addresses includes a plurality of dedicated data Blocks for storing User Data and a plurality of Dedicated Overhead Blocks for storing Overhead Data including a first Dedicated Data Block and a second Dedicated Data Block. Each Dedicated Overhead Block is identically comprised of a plurality of separately addressable Overhead Pages following an identical sequence of page addresses. Each Overhead Page is comprised of a plurality of independently addressable and independently programmable segments, including a plurality of Overhead Segments used for storing Overhead Data. Each Overhead Segment supports one Virtual Logical Block of User Data, and comprises a physical Address Register for storing a Physical Address for locating corresponding User Data and a flag field. A first group of Virtual Logical Block Addresses including a first VLBA is assigned to the first Dedicated Overhead Block, such that overhead data generated in support of the first VLBA will be stored in an Overhead Segment within the first Dedicated Overhead Block.

According to one embodiment of the present invention, sequential VLBA's within the first group of VLBA's are respectively correlated to sequentially addressed Overhead Pages within the first Dedicated Overhead Block including a first Virtual Logical Block Address correlated to a first Overhead Page within the first Dedicated Overhead Block, such that Overhead Data supporting the first Virtual Logical Block Address will be stored in an Overhead Segment within the first Overhead Page.

According to one embodiment of the present invention, each of the plurality of Dedicated Overhead Blocks further comprise of a fixed Overhead Field and a Random Overhead Field, the fixed Overhead Field being comprised of a plurality of consecutively addressed Overhead Pages, wherein consecutively addressed Overhead Segments within the Fixed Overhead Field are respectively correlated to sequentially addressed Virtual Logical Block Addresses within the first group of Virtual Logical Block Addresses.

According to one embodiment of the present invention, each Dedicated Overhead Block is further comprised of a plurality of Super Overhead Fields including a first Super Overhead Field, a Super Overhead Field comprised of a whole number of pages, each Super Overhead Field within the first Dedicated Overhead Block comprised of an identical number of pages, wherein consecutive Overhead Segments within first Super Overhead Region are respectively assigned to consecutively addressed Virtual Logical Block Addresses which comprise a first SuperBlock.

These and other advantages will become apparent to those skilled in the art.

DETAILED DESCRIPTION OF THE PREFERRED EMBODIMENTS

Figure 1:
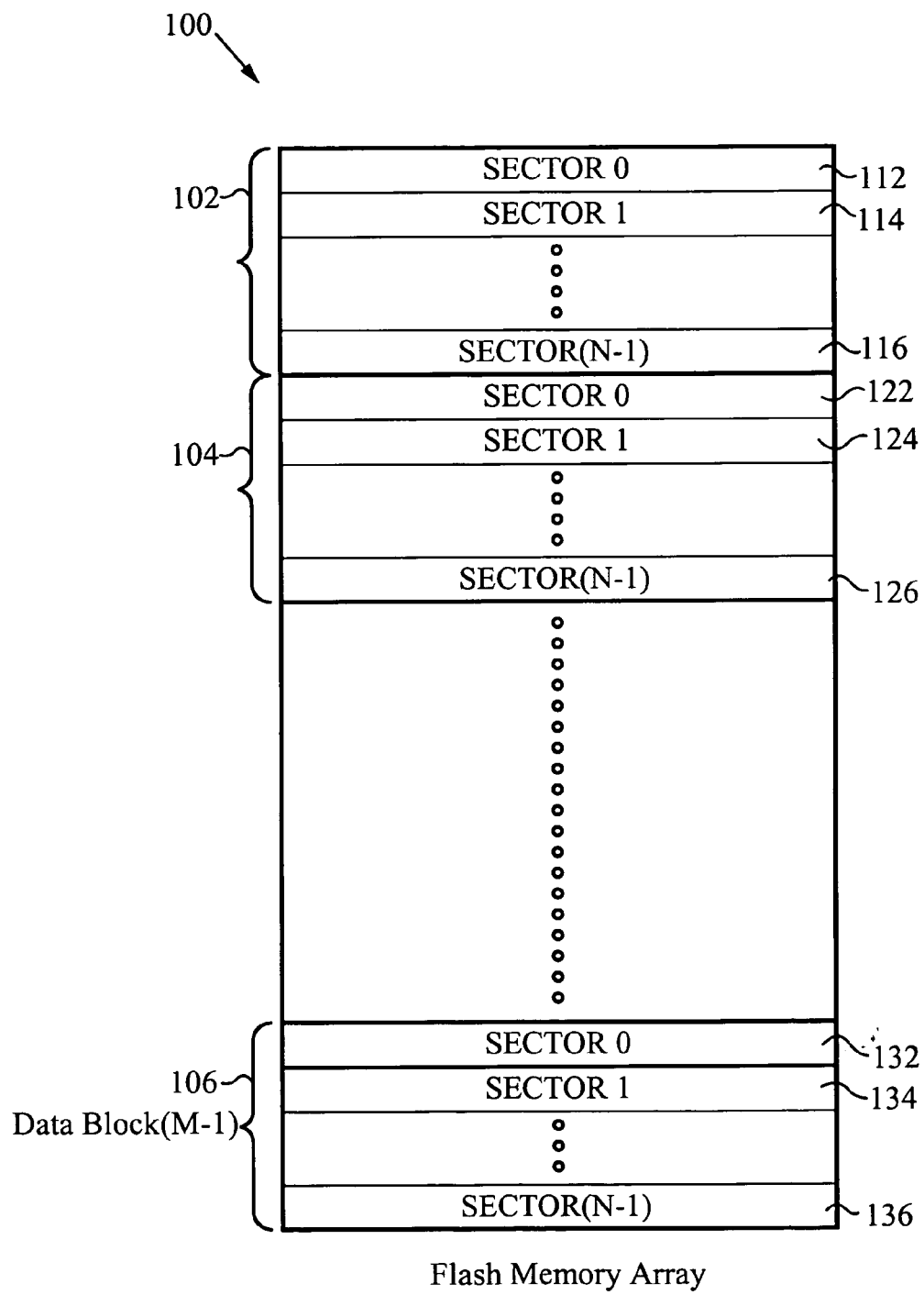
FIG. 1 is a flash memory array comprising multiple Data Blocks, each block comprising multiple sectors according to the prior art.

The embodiments recited herein are neither intended to limit the scope of the invention, nor to exhaust every possible variation or nuance of the described invention. Minor variations of the disclosed invention will immediately become apparent to those skilled in the art. In particular, numerous illustrations are made with respect to data storage architecture, and the fields and registers within a Flash Memory Unit. The descriptive terms such as Dedicated Overhead Blocks, Overhead Pages, Overhead Segments, Super Overhead Fields and other architectural components are arbitrary term used to illustrate the architecture, data storage fields and registers of the present invention. Equivalent structures or architectures may be designed using any variety of architectural terms. Similarly, the relative storage capacities of various data storage fields are not intended to limit the present invention to the particular embodiment illustrated. Neither are the number of component memory fields or registers comprising a larger memory field intended to limit the invention to a particular ratio of component structures. Those skilled in the art will understand that these specific embodiments with fixed numbers and ratios of are offered for illustrative purposes only. Moreover, it is understood that in a binary addressing scheme, a Block comprised of multiple pages, each page being comprised of multiple segments can equally be regarded as a Block simply comprised of multiple consecutive segments. For example, an eight bit field can equally be broken up into four Blocks, each comprising four pages, each page comprising sixteen segments, or it may simply be represented as four blocks comprising sixty-four segments. It will be readily apparent to those skilled in the art that there are numerous other possible structural representations of this same data field. The depiction of a specific architecture herein is intended to be interpreted in its broadest sense, encompassing any equivalent variation function which behaves in an equivalent manner. Accordingly, the figures and detailed description recited herein are merely intended to illustrate a particular implementation of the present invention, and to enable those skilled in the art to utilize the principles of the invention set forth herein.

In its proper operating environment, the flash memory system is coupled to a host digital system, such as a host computer system, digital camera, etc. The flash memory system provides nonvolatile mass storage for use by the host digital system. Data to be stored in or to be read from the flash memory system is associated by the host digital system with one of a plurality of logical block addresses. The flash memory system transforms the logical block address into one of a plurality of physical block addresses—refer to the "Background of the Invention" for a discussion of the need for this transformation.

Preferably, the flash memory system comprises at least one flash memory device for storing the data and correlating logical and physical addresses, and a controller for controlling operations performed by the flash memory system. The controller is typically integral to the flash memory system itself. Each flash memory device comprises a flash memory array, the flash memory array including a plurality of non-volatile flash memory cells.

Figure 2:
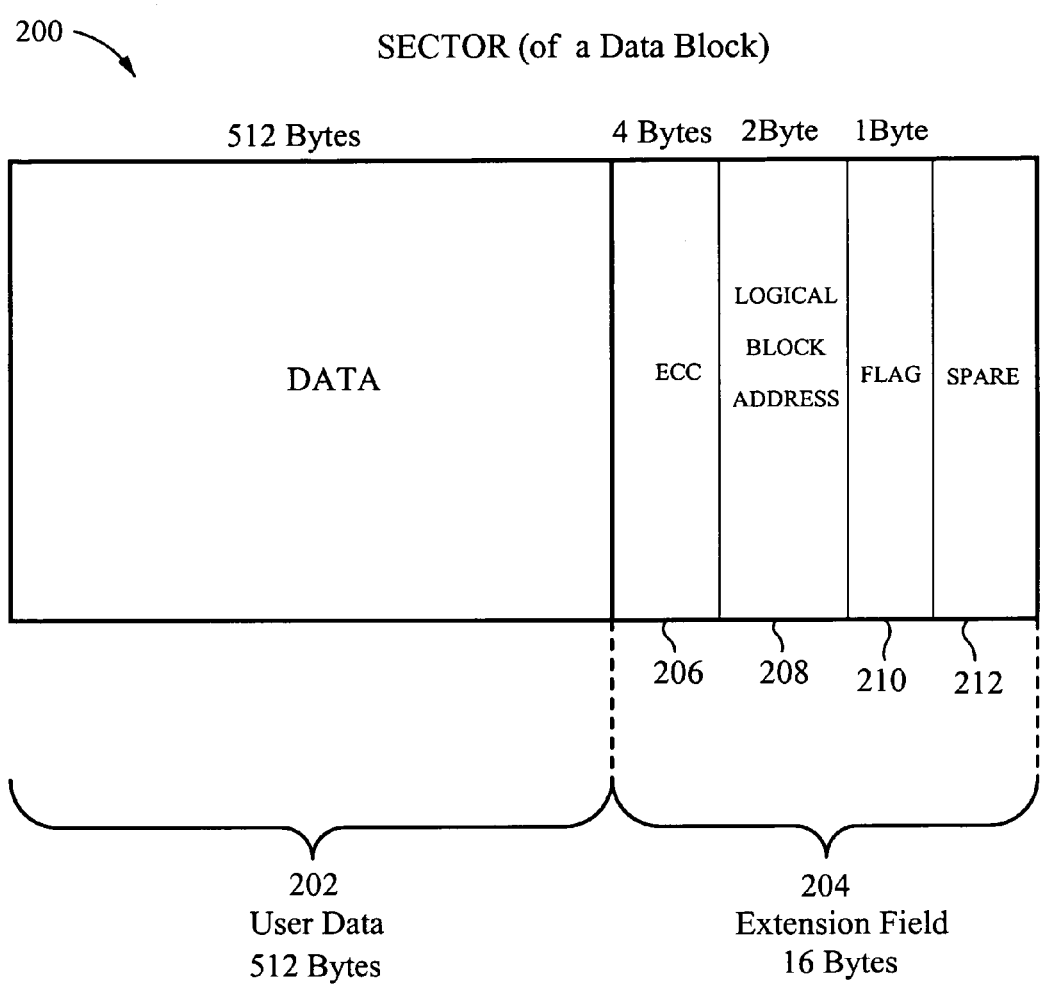
FIG. 2 is a data sector comprising a User Data Area and an Overhead Data area according to the prior art.
Figure 3:
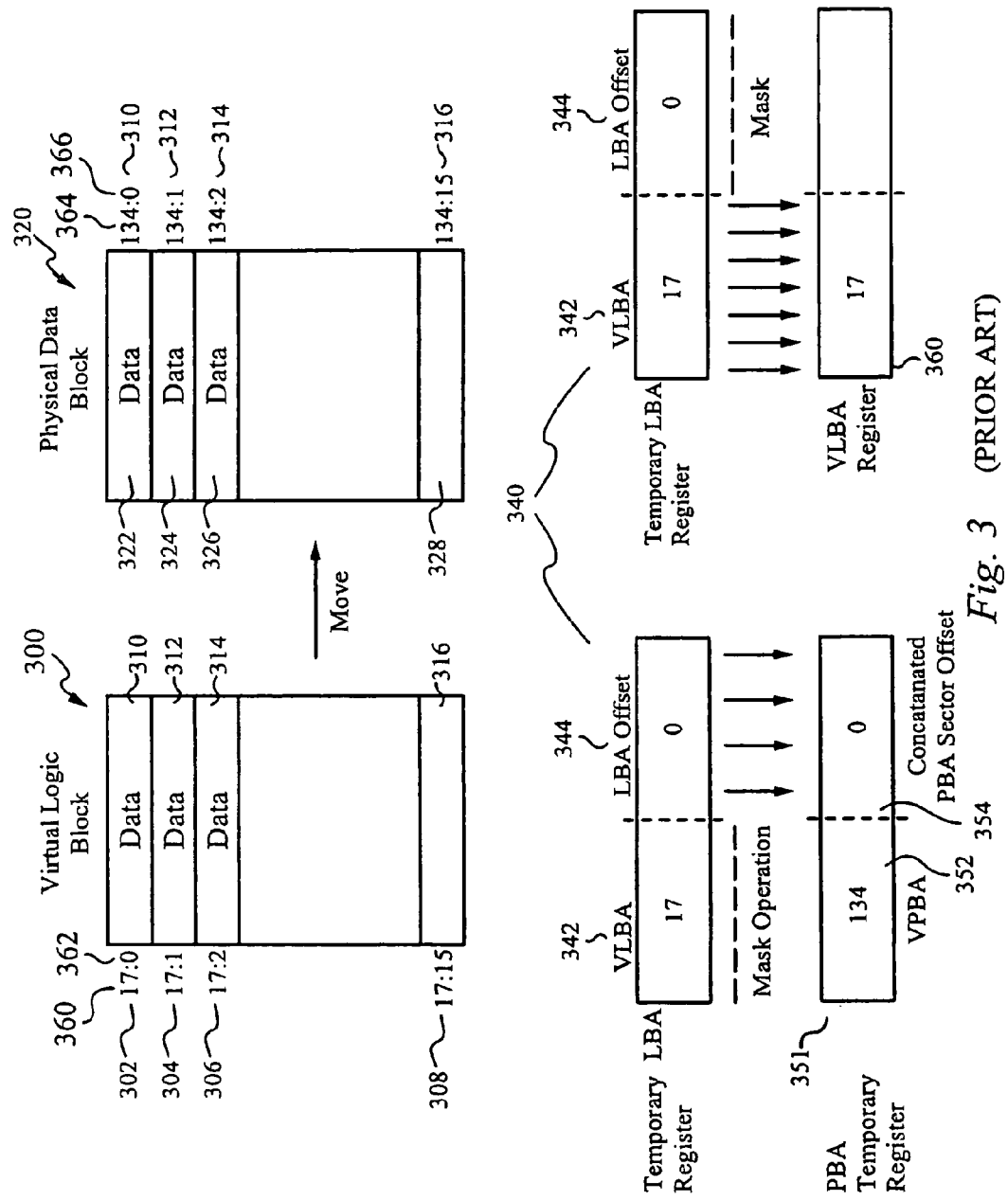
FIG. 3 illustrates the masking and concatenation processes for storing and retrieving a Virtual Logical Block of data in a Physical Data Block.
Figure 7:
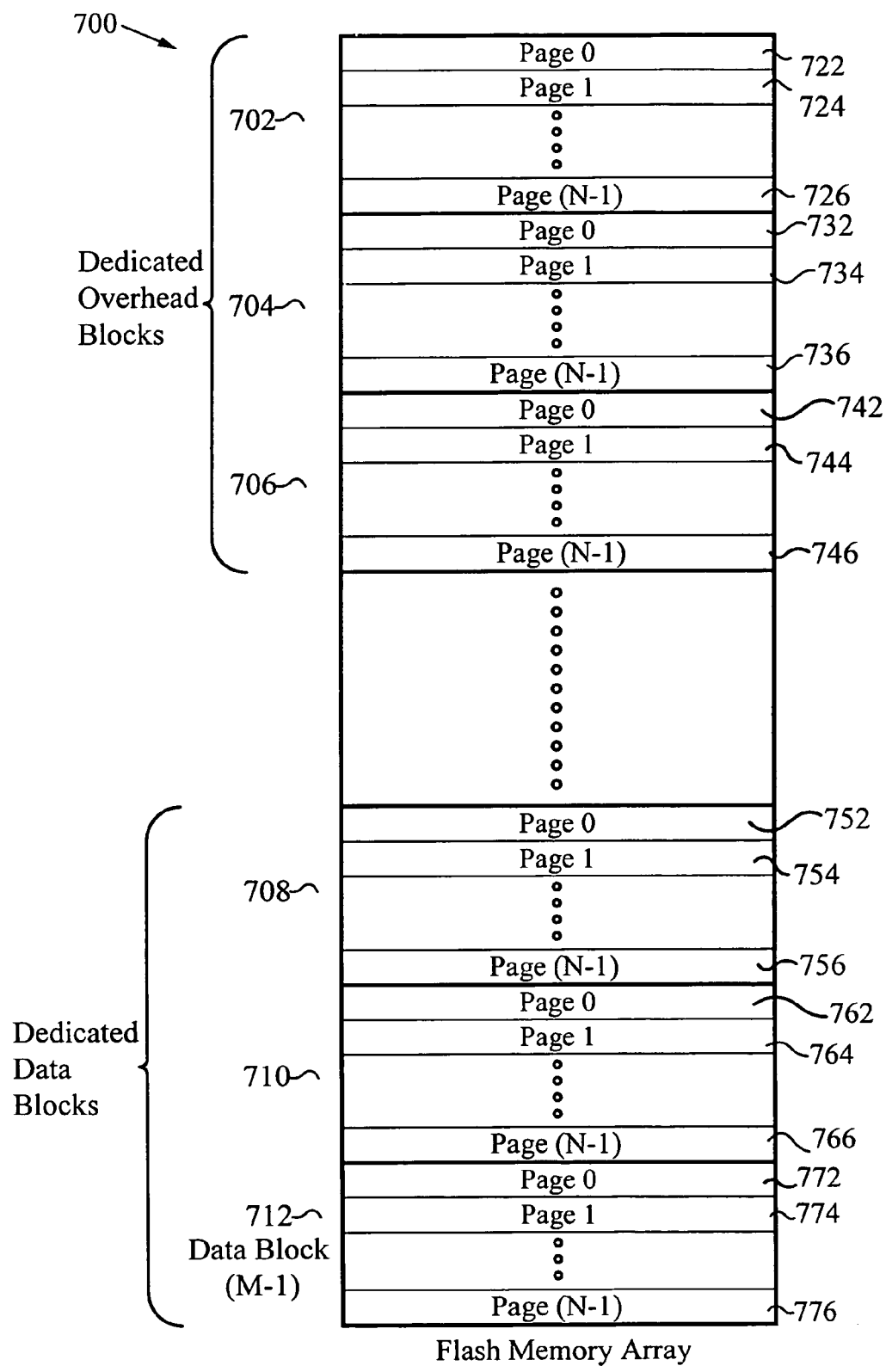
FIG. 7 shows a Flash Memory System divided between separate Dedicated Data Blocks and Dedicated Overhead Blocks according to the present invention.

FIG. 7 illustrates a Flash Memory architecture according to the present invention which segregates Overhead Data and User Data into separate Physical Memory Blocks that are separately addressed, independently programmable, and independently erasable. The non-volatile memory 700 of a flash memory is divided into Physical Memory Blocks comprising Dedicated Overhead Blocks 702, 704, 706 and Dedicated Data Blocks 708, . . . , 712. If sub-mapping of the respective blocks is performed, the Dedicated Overhead Blocks 702, 704, 706 need not be mapped according to the same sub-mapping scheme as the Dedicated Data Blocks 708, . . . , 712. The architecture according to FIG. 7 facilitates independent programming, data access, and erasure of User Data and Overhead Data. In comparing the architecture of the present invention disclosed in FIG. 7 to the architecture of the prior art disclosed in FIG. 1, similarities and differences can immediately be noted. For consistency, data blocks remain numbered from zero through M−1. Rather than being comprised of sectors, however, each data block is now comprised of pages. The distinction is not simply nominal, but goes to the heart of the present architecture. It will be remembered that a sector of the prior art attempted to imitate a sector of a hard drive. Therefore, each sector 112, . . . , 136 of FIG. 1 is seen in greater detail in FIG. 2 to comprise a five hundred twelve byte User Data area 202 and an extension field 204 comprising sixteen bits of overhead data. In the memory architecture according to the present invention, overhead data is not stored in the same "sector" as User Data. Accordingly, an area of memory capable of storing a Logical Block of data is no longer called a sector but a page. Unlike a sector, which combined User data and overhead data, a page will either be dedicated to the storage of User Data, or to the storage of overhead data, but not both. As in the prior art, the data blocks 702, . . . , 712 typically comprise an amount of memory sufficient to store a Virtual Logical Block of data, just as each page 722, . . . 776 advantageously comprises an amount of memory sufficient to store one Logical Block of data.

A second distinction from the prior art is noted in that there are now two distinct forms of data blocks, Dedicated Overhead Blocks 702, . . . , 706 and Dedicated Data Blocks 708, . . . , 712.

Figure 8A:
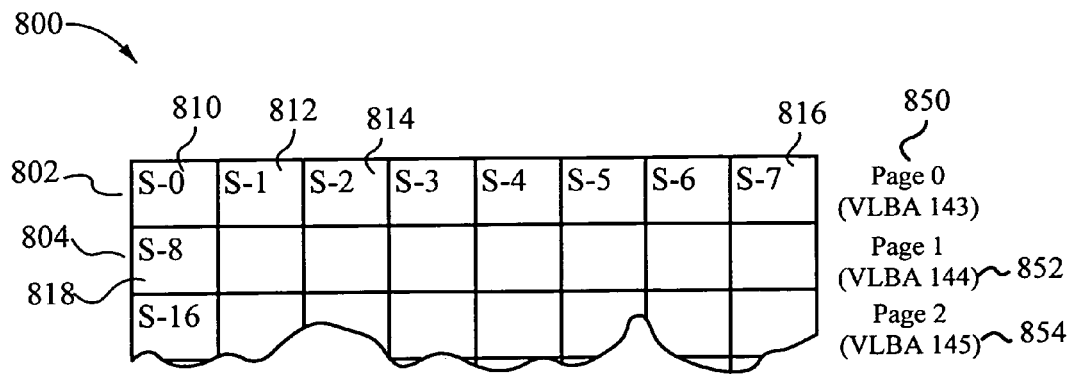
FIG. 8A shows component pages and segments of a Dedicated Overhead Block according to the present invention.

FIG. 8A discloses a Dedicated Overhead Block 800 incorporating one possible sub-mapping scheme according to the present invention. A sixteen page block is used throughout much of the disclosure for exemplary purposes only. A block of any page length is envisioned, although the preferred embodiment would advantageously utilize a block length which is a power of two, such as sixteen or thirty-two pages. FIG. 8A discloses a series of sixteen overhead pages 802, . . . 806, each page comprising a plurality of overhead segments, each segment supporting an amount of User Data Stored in a single Dedicated Data Block 708, . . . , 712.

Figure 8A:
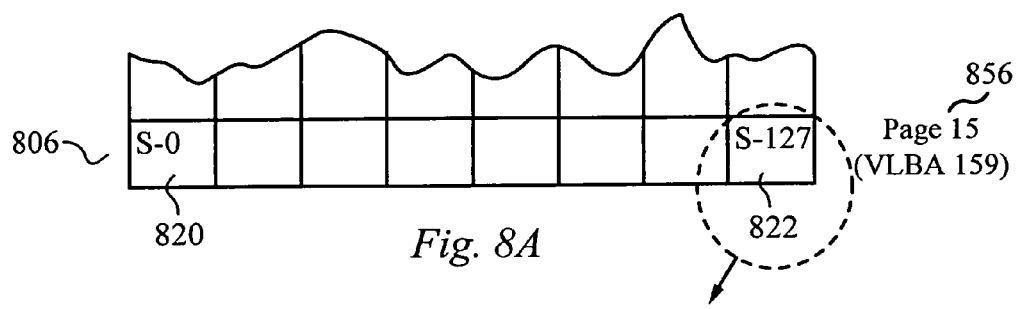
Figure 8B:
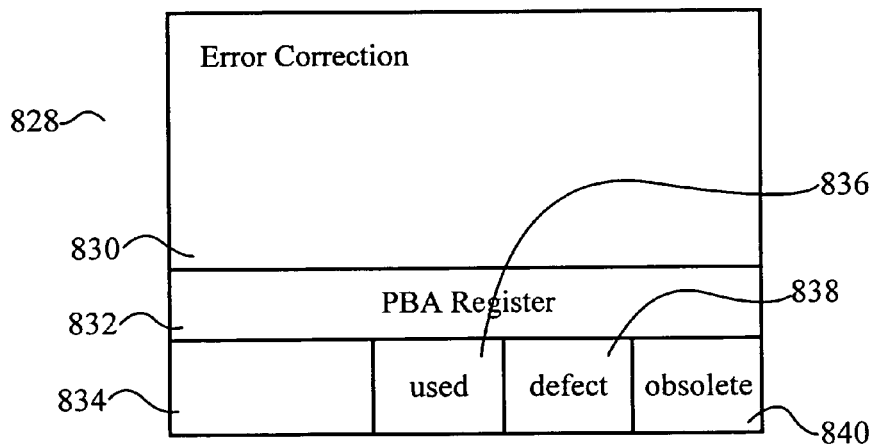
FIG. 8B is a more detailed view of an Overhead Segment according to the present invention.

Although FIG. 8A is shown to comprise eight overhead segments per overhead page, the number of segments per page ultimately depends on how much data is stored in each segment, as illustrated further in conjunction with FIG. 8B. According to FIG. 8B, an Overhead Segment advantageously contains an Error Correction Field 830, a PBA register 832, and a Flag Field 834. The flag field preferably comprises a used flag 836, a defective flag 838 and an obsolete flag 840. When respectively defined according to a second value, these three flags will respectively indicate that an Overhead Segment is used, defective, or obsolete. An "available" Overhead Segment is defined as a segment that is un-used, non-defective, and not obsolete. A "current" overhead segment is defines as a segment that is used, non-defective and not obsolete. In contrast to the prior art, however, which had a fixed size for the extension field, the present invention affords a great deal of flexibility in the size of an overhead segment. According to the prior art, an extension field 204 of sixteen bytes afforded at least four bytes for Error Correction, even after leaving a minimum of one space byte. The amount of memory consumed by the extension field 204 (FIG. 2) remains the same if every bit within the extension field is used, or if none of them are used. Accordingly, there was no motivation to reduce the ECC field 204 according to the prior art. When removing overhead functions to a separate memory area, however, as in the present invention, the amount of memory used for overhead functions will affect the consumption of flash memory. A reduction in the amount of data stored in a single segment will increase the number of segments per page, and decrease the flash memory consumed by the dedicated overhead regions.

Although memory can be saved by eliminating any of the registers found in FIG. 8B, the elimination of certain registers will render the invention largely unworkable. For example, the system becomes fundamentally unworkable without a PBA register 832 cross referencing the overhead segment to the block of User Data which it supports. Therefore, according to the present invention, the preferred means of controlling the size of an Overhead segment is by determining the amount of data dedicated to the Error Correction Field 830. The more complex and effective an error correction program is, the more data it will typically require to support a block of User Data, resulting in a larger and more memory intensive overhead segment. The less complex and powerful an error correction program, the less ECC data will be required to support a block of User Data. Without any error correction data at all, an overhead segment 828 must minimally contain a two byte PBA register 832 and a one byte flag register 834, totaling three bytes. Not shown in FIG. 8B is a cross reference to a Logical Block Address. Although it is not essential that a cross reference to a logical address be stored within an overhead segment 828, it is essential that there exists somewhere a non-volatile correlation of logical and physical addresses which can, upon power up, provide this correlation data to the space manager 900, discussed in conjunction with the prior art, and discussed further herein in conjunction with the present invention. According to the preferred embodiment of the present invention, however, a range of VLBA's associated with a Dedicated Data Block will be stored in the extension field at the end of a current page within the Dedicated Data Block.

According to Error Correction Code (ECC) Design-one, no error correction field 830 is incorporated in an overhead segment 828. In digital applications, addressable memory consumed for a given application is advantageously divisible by powers of two. Accordingly, a three byte overhead segment (the PBA register 832 and Flags 834) will preferably be stored in a four-byte segment. At four bytes per overhead segment, Design-one will allow one hundred twenty eight overhead segments per overhead page.

According to ECC Design-two, a parity bit error correction process would utilize a single parity-bit of error correction data per Page 752, . . . , 776 of User Data. A sixteen page Dedicated Data Block of User Data, e.g. 708, would therefore require sixteen bits, or two bytes, of error correction data. It is noted that an error correction field 830 of two bytes, plus two bytes for a PBA register 832 and one byte for a flag field 834 comes to five bytes of overhead data per overhead segment supporting each Dedicated Overhead Block. Again, because an addressable memory area consumed in a given application is advantageously divisible by powers of two, the five used bytes for Design-two would preferably be stored in an eight-byte overhead segment. Using eight byte overhead segments, a total of sixty four segments could be stored in a single overhead page according to Design-two.

According to ECC Design-three, an error correction code requiring three bytes of ECC data to support each page of User Data would amount to forth-eight bytes of ECC data to support sixteen pages of User Data. An ECC field 830 of forty eight bytes, plus a two byte PBA register 832 plus a one byte flag field 834 comes to a total of fifty-one bytes of overhead data per overhead segment 828 to support one Dedicated Data Block 708, . . . , 712 of user data. Again, because an addressable memory area consumed in a given application is advantageously divisible by powers of two, fifty-one bytes of overhead data would require a sixty-four byte overhead segment 828. Recalling that a page comprises five hundred twelve bytes of accessible data, design-three would therefore result in eight overhead segments per overhead page.

According to ECC Design-four, a four-byte ECC 828 code such as the ECC code used in the prior art would be incorporated into the present application. At this level of memory consumption, sixteen pages of User Data would require sixty-four bytes of ECC data. An Error Correction Field 828 of sixty four bytes, plus a two byte PBA register 832, plus a one byte flag register 834 requires an overhead segment 828 of 67 bytes to support a sixteen page Dedicated Data Block 708, . . . 712 of user data. Because the next available memory area divisible by a power of two is one hundred twenty-eight bytes, the incorporation of design four, which would utilize the error correction code commonly found in the prior art with the present invention, would allow only four overhead segments 810, . . . , 822 per overhead page 802, . . . 806.

It should be recognized that the present invention is not limited to any of these four ECC designs. Larger and more elaborate error correction algorithms could be utilized which ultimately require more data resulting in larger overhead segments 828. A single overhead segment 828 could ultimately require an entire overhead page, or even several overhead pages. Although such applications are within the scope of the present invention, according to the preferred embodiment, the error correction capabilities of designs one through four will be the most advantageous trade off between error correcting power and overhead memory consumption.

As noted, the PBA register 832 according to present invention cross references the Overhead Data to the User Data. This architectural feature was unknown in the prior art since User Data and its corresponding overhead data were located at the same Physical Block Address.

Figure 4:
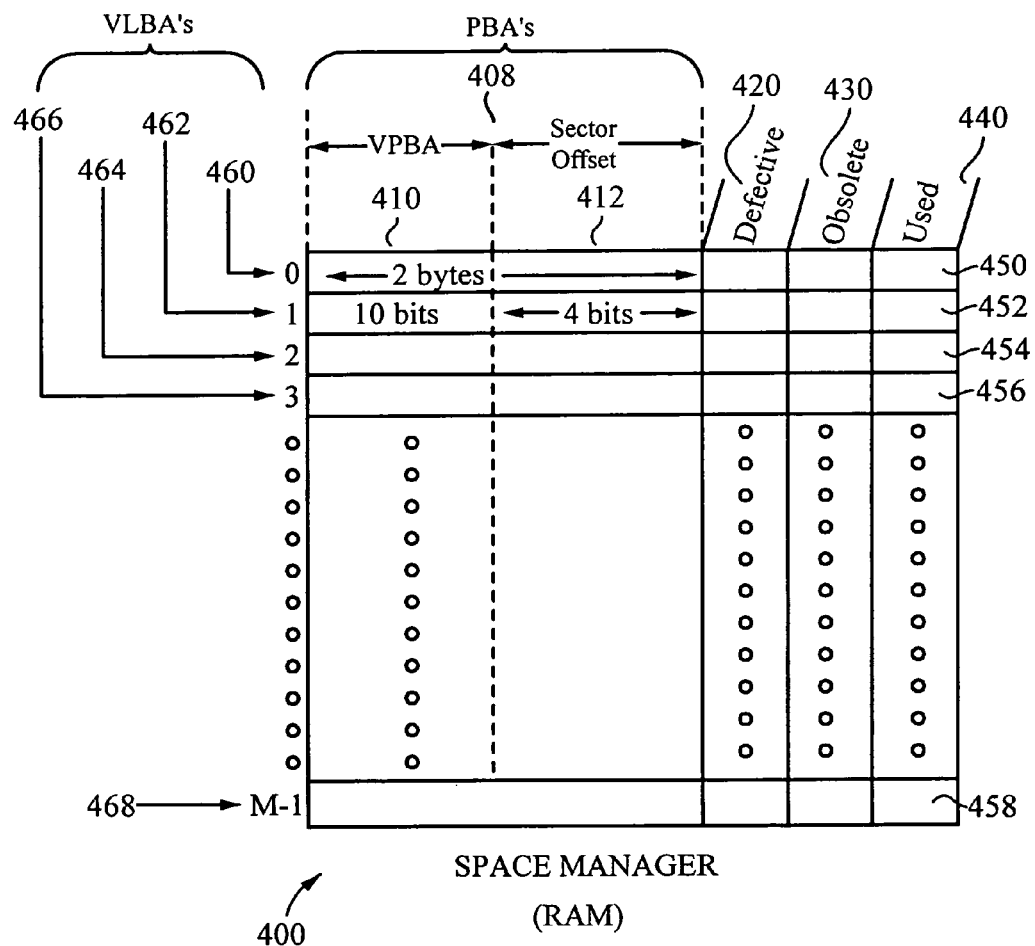
FIG. 4 discloses a space manager according to the prior art.
Figure 5:
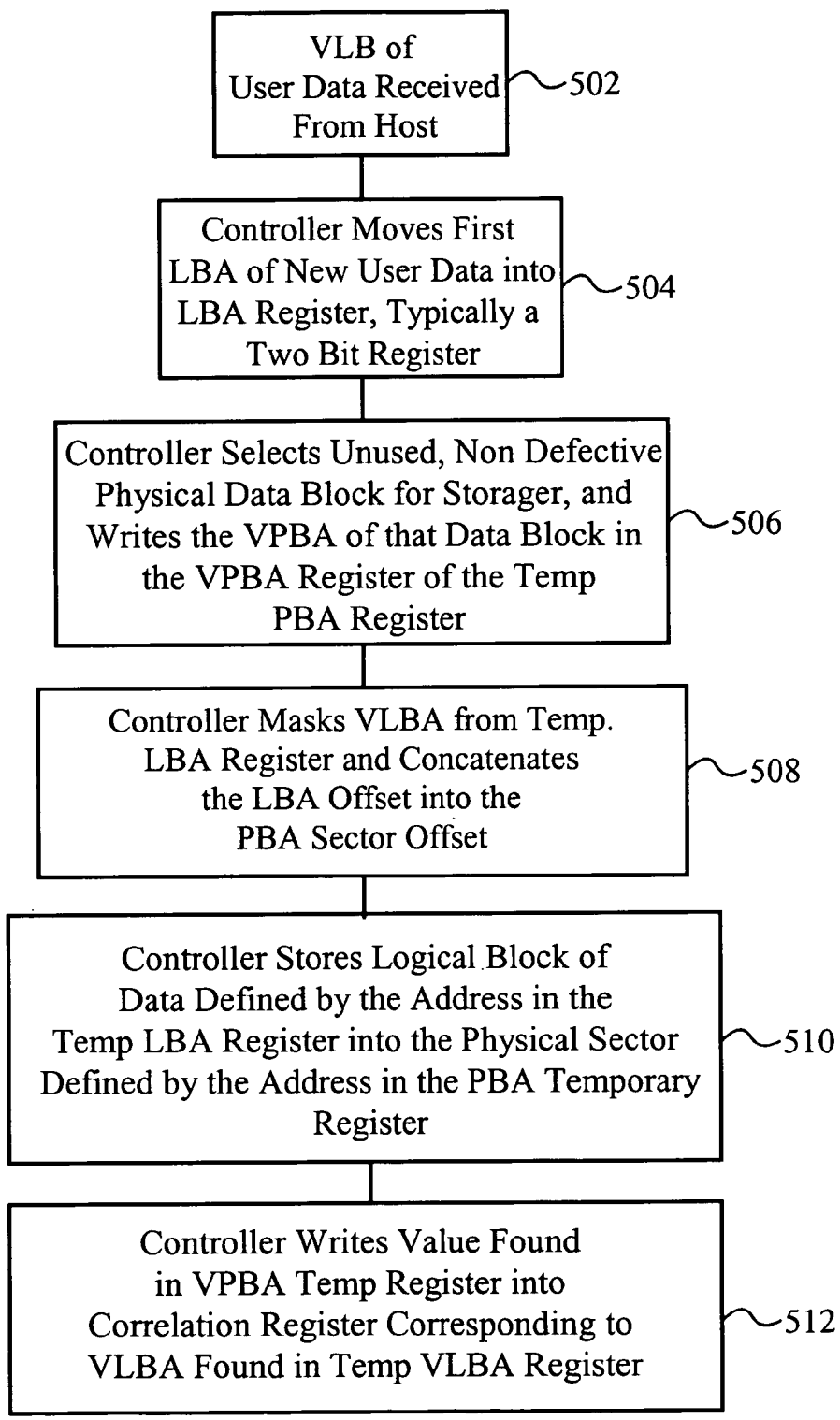
FIG. 5 illustrates one way of defining physical addresses in the storage of data according to the prior art.
Figure 6:
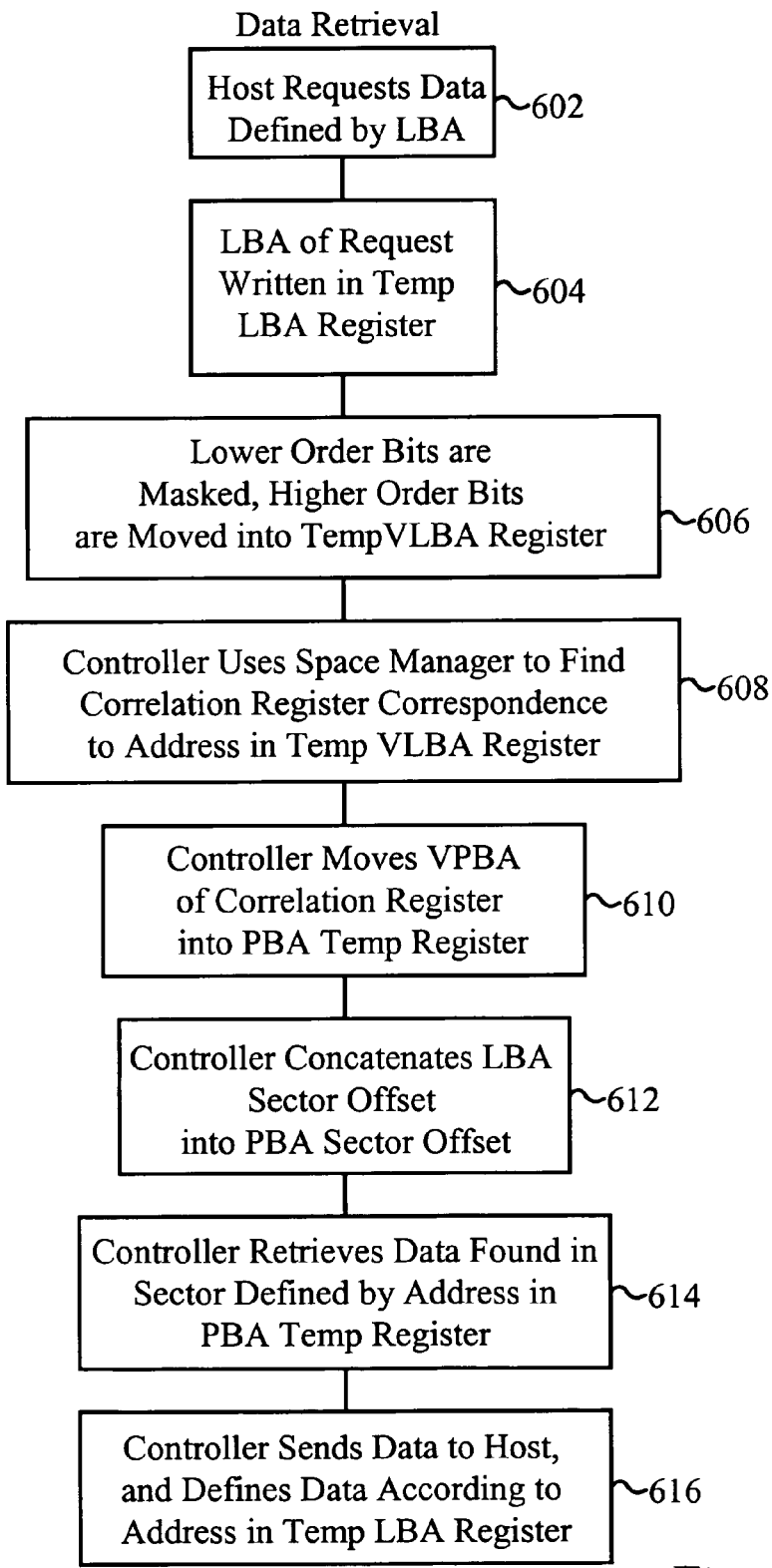
FIG. 6 illustrates one way of retrieving stored data and re-assigning the original virtual address according to the prior art.
Figure 9:
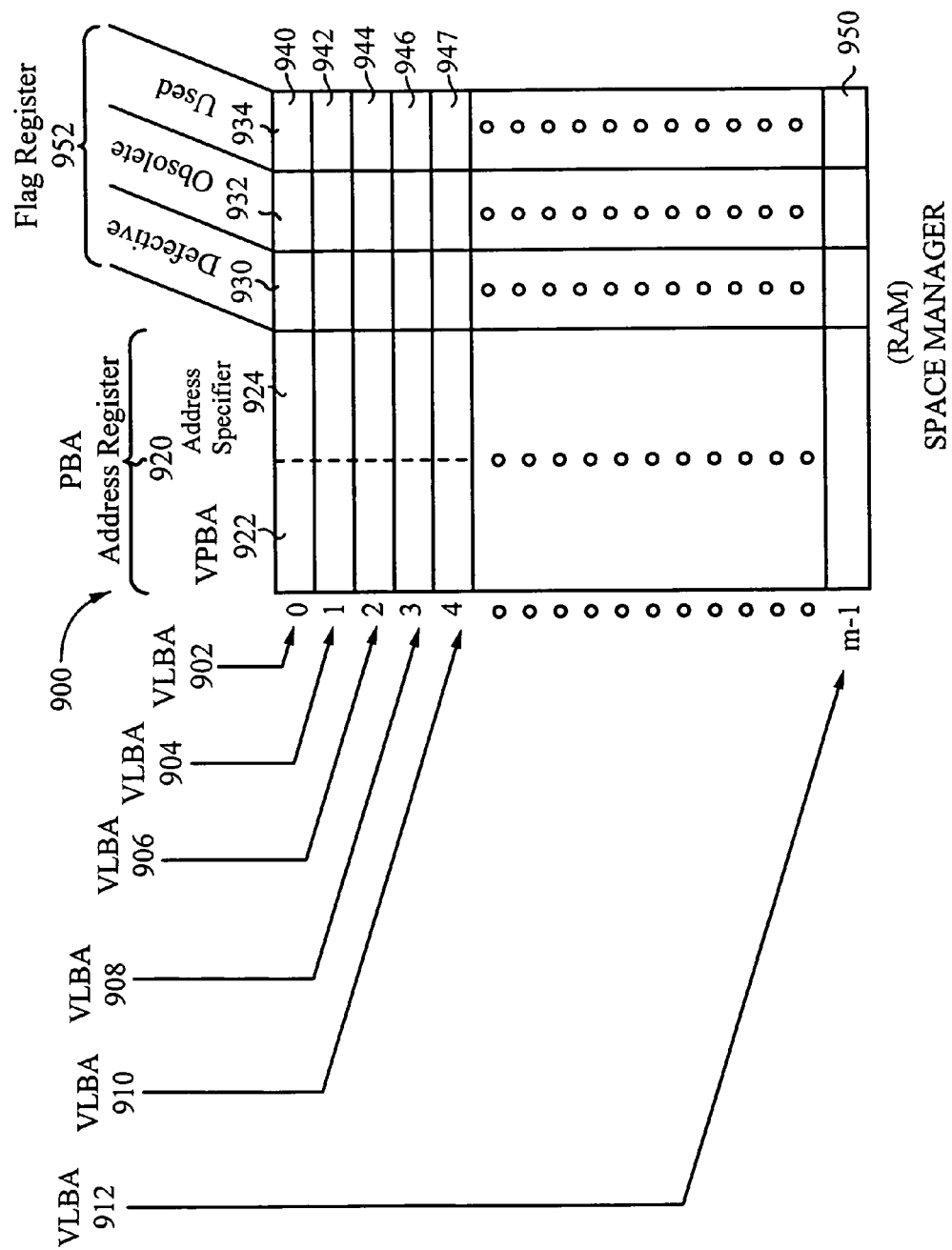
FIG. 9 is a space manager according to the present invention.

FIG. 9 discloses an embodiment of a space manager according to one embodiment of the present invention. Consecutively numbered VLBA's 902, . . . , 912, each VLBA representing an amount of data equivalent to the amount of data currently stored in a Physical Data Block, are correlated to a series of Correlation Fields 940, . . . , 950. Each Correlation Field advantageously comprises an Address Register 920 and a Flag Register 952. It will be recalled that, according to the prior art, wherein the User Data and Overhead Data were defined according to the identical Physical Block Address. The address register 408 (FIG. 4) referenced both User Data and Overhead Data. Because the Overhead Data and User Data are stored separately according to the present invention, the Address Register 920 of the Space Manager 900 may only reference one of them. According to the preferred embodiment, it is the Overhead Data that is referenced in the Space Manager 900. The Space Manager 900 of the present invention does not reference the User Data directly.

The Address Register 920 is divided into two sub-registers, a VPBA Register 922 and a Address specifier 924. The VPBA Register 922 defines a Physical Block Address where overhead data is stored. The contents of the Address specifier 924 varies depending upon the embodiment of the present invention. According to one embodiment discussed herein, it may define both a page, and segment offset within that page. According to an alternative embodiment, it may define only the page wherein a segment of overhead data may be found. When a Address specifier 924 contains a page Address only, a controller will indirectly locate a specific segment by first accessing the page referenced in the address specifier 924. The Status Flags within the Space Manager 900 are advantageously comprised of a Defective Block Flag 930, an Obsolete Data Flag 932, and a Used Block Flag 934. The status flags within the space manager associated with a particular overhead block define the status of a particular overhead block, in contrast to the flags located in specific Overhead Segments, which define the status of the User Data and the Dedicated Data Block identified by that Overhead Segment.

Figure 10:
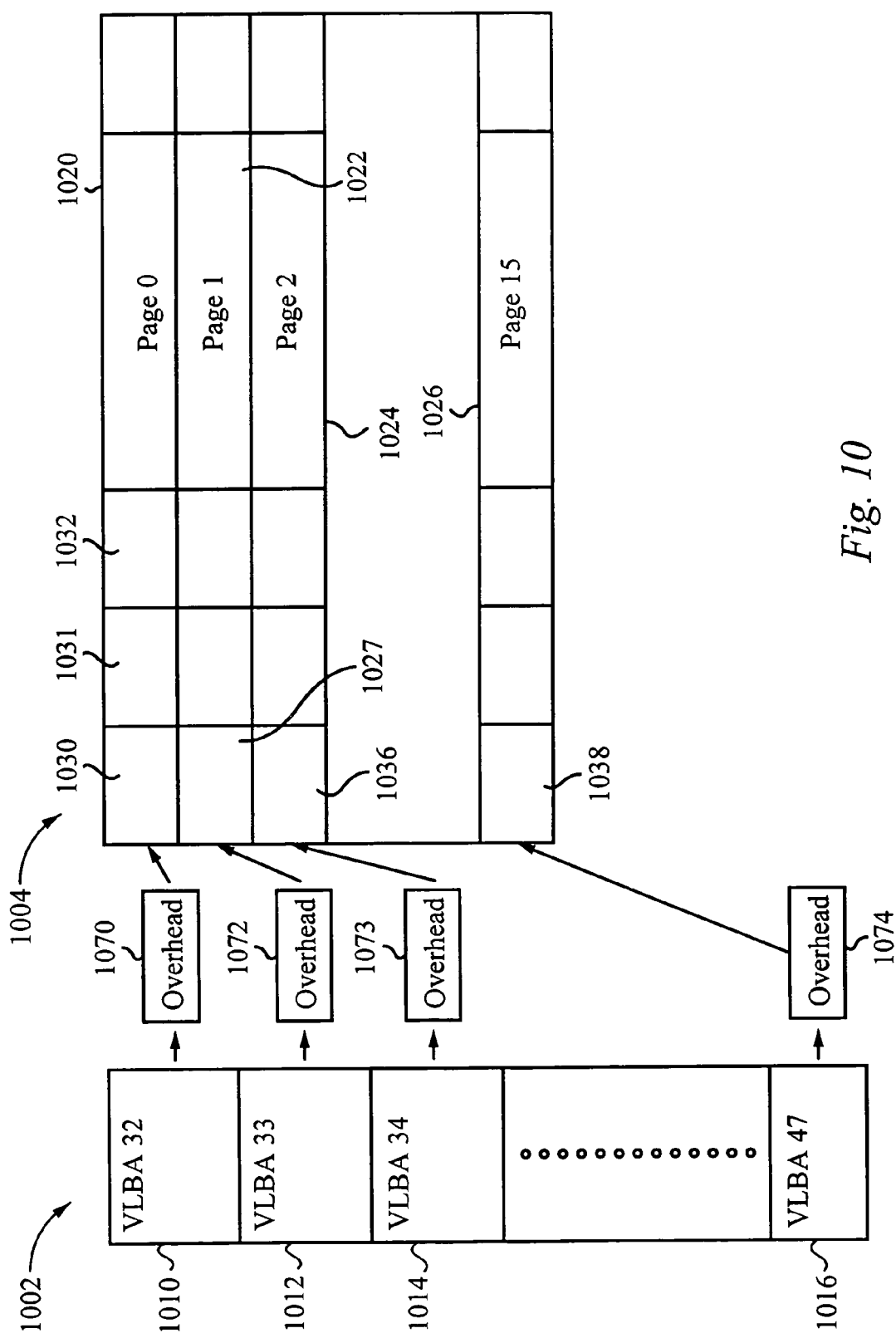
FIG. 10 illustrates overhead data supporting specific VLBA's within a group of VLBA's being respectively stored in specific pre-determined pages within a Dedicated Overhead Block according to the "block" method.

According to the "block" embodiment of the present invention, as described in conjunction with FIG. 10, consecutive overhead pages 1020, . . . , 1026 within a Dedicated Overhead Block 1004 are assigned to support consecutive Virtual Logical Blocks of User Data 1010, . . . , 1016. Pictured in FIG. 10 is a stack 1002 of sixteen consecutively addressed Virtual Logical Blocks 1010, . . . 1016 of User Data numbering from VLBA thirty-two through VLBA forty-seven. The stack 1002 of VLBA's is supported by a Dedicated Overhead Block 1004 of sixteen pages 1020, . . . 1026. The number of consecutively addressed VLBA's is displayed in FIG. 10 has been selected to match the number of Overhead Pages within the Dedicated Overhead Block 1004. In the storage of overhead data, User Data defined according to the first Virtual Logical Block Address 1010 in the stack 1002 will store its overhead data 1070 in an overhead segment of the first page 1020 of the Dedicated Overhead Block 1004. User Data defined according to the second Virtual Logical Block Address 1012 in the stack 1002 will store its overhead data 1072 in an overhead segment of the second page 1022 of the Dedicated Overhead Block 1004. The third VLBA will store its overhead data 1073 in the third page, and so forth. The process need not be sequential, however. Although the sixteenth Virtual Logical Block of User Data, VLBA47 1016 will store its overhead data 1074 in the sixteenth overhead page 1026 of the Dedicated Overhead Block 1004, this event may precede the storage of overhead data in the first page 1020. Moreover, the process need not be balanced or evenly distributed. That is, multiple successive updates of the sixteenth VLBA 1016 may result in multiple updates of overhead data 1074 stored in the sixteenth overhead page 1026 before any User Data is received according to the third VLBA 1014 in the stack 1002.

Figure 11:
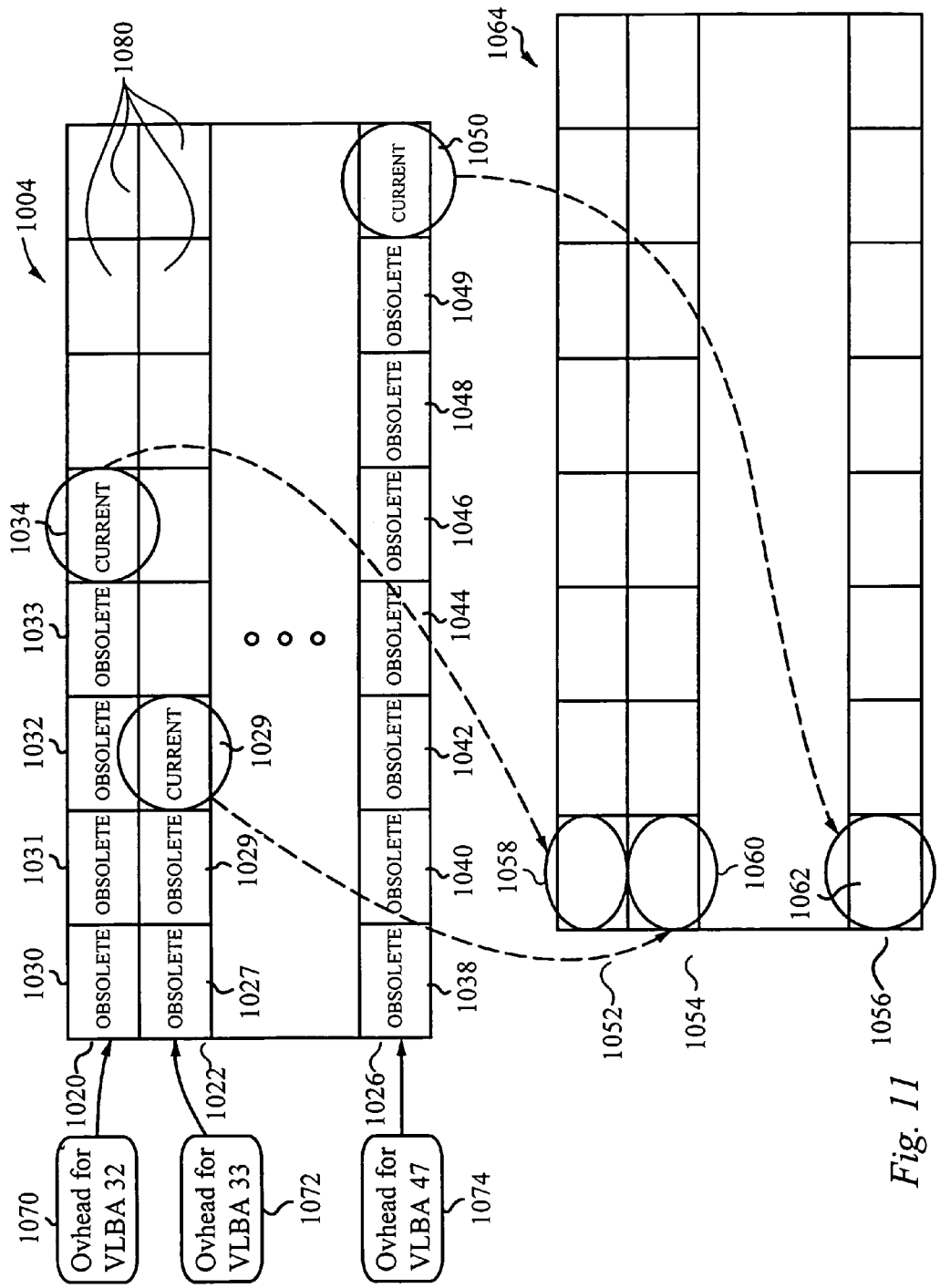
FIG. 11 illustrates the consolidation of all current sectors within a "full" Dedicated Overhead Block into a new Dedicated Overhead Block according to the "block" embodiment.

As User Data defined according to the same VLBA is updated, a new set of Overhead Data is generated to support that User Data. Successive generations of overhead data according to the same VLBA are stored in consecutively addressed Overhead Segments within the overhead page assigned to that VLBA. Each time the overhead data of a particular VLBA is updated, the new overhead data is stored in the next consecutive Overhead Segment of the Overhead Page to which that VLBA is assigned. In FIG. 11, the first overhead page 1020 is seen to have been updated a number of times. The first four Overhead Segments 1030, 1031, 1032 and 1033 have been marked as obsolete. The last consecutive Overhead Segment to have been filled 1034 is the current overhead segment. The second overhead page 1022 shows two obsolete overhead segments 1027, 1028 followed by a current overhead segment 1029. The sixteenth overhead page 1026 is full. That is to say, all segments except for the final segment 1050 have been obsoleted. The final segment 1050 is current.

In order for the controller to retrieve data, the controller of the flash memory system must identify the current overhead segment corresponding to a particular VLBA. Similarly, in order to store new Overhead Data, the controller must identify the next available Overhead Segment, the term "next" referring to the respective addresses assigned to the Overhead Segments. Identification of the next available Overhead Segment is made possible through the page address referenced in the Address specifier 924 within the Space Manager 900 working in conjunction with the status flags 834 (FIG. 8) within individual Overhead Segments that comprise the referenced page.

According to one embodiment, the address specifier 924 will contain only the overhead page 1020, . . . , 1026 number assigned to a particular VLBA 1010, . . . , 1016. To store and retrieve data, however, the exact overhead segment must be known. By examining the VPBA Register 922 and Address specifier 924 within the Space Manager 900, the controller is able to identify the VPBA and Page address used for storage of overhead data associated with a particular VLBA. The controller then accesses to the overhead Page 1020, . . . , 1026 specified in the Address Specifier 924, and sequentially examines successive overhead segments 1030, 1031, 1032, etc. within the Page. This will advantageously include an examination of the Used Flag 836, the Defective Flag 838 and the Obsolete Data Flag 840 of each segment. According to the information gained from this examination, the controller can identify the current segment which identifies within its PBA register the location of the current User Data. In the same way, through an examination of the status flags, the controller can identify the next unused and non-defective segment for storing new Overhead Data. An alternative embodiment is envisioned however in which the address specifier 924 includes a segment number, thereby enabling the controller to identify the current segment, and eliminating the need to scan a series of segments for flag status.

The processes of segment consolidation and block erasure according to the block-embodiment is also illustrated in FIG. 11. Consolidation is set to occur when a Dedicated Overhead Block becomes "full," which will normally be established when any single overhead page 1020, . . . 1026 within that Dedicated Overhead Block 1004 becomes full, such as the sixteenth Overhead Page 1026 of FIG. 11. When the Dedicated Overhead Block becomes full, the controller identifies a new Dedicated Overhead Block 1064. The controller then examines every page 1020, . . . 1026 within the "full" Dedicated Overhead Block 1004 to identify the current Overhead Segment 1034, 1029, . . . , 1050 in every page that contains a current overhead segment. Because old segments in a page are advantageously flagged as obsolete when new segments are filled with overhead data, the current overhead segment of each overhead page will preferably be identified through an examination of the status of various flags 836, . . . 840 within the flag registers 834. A page will have at most one current segment. As illustrated in FIG. 11, when the Dedicated Overhead Block 1004 has become "full", overhead data within the current segment 1034 of the first overhead page 1020 is moved to the first overhead segment 1058 of the first overhead page 1052 of the new Dedicated Overhead Block 1064. Overhead data from the current segment 1029 of the second overhead page 1022 is moved to the first overhead segment 1060 of the second overhead page of the new Dedicated Overhead Block 1064. Overhead data from the current segment 1050 of the sixteenth overhead page 1026 is moved to the first overhead segment 1062 of the sixteenth overhead page 1056 of the new Dedicated Overhead Block 1064. Accordingly, in the process of consolidation, the data from the current overhead segment of each respective page is moved to the first overhead segment of the same respective page in a new unused Dedicated Overhead Block. Following consolidation, the Used Block is erased, or flagged for subsequent erasure. In conjunction with consolidation to a new Dedicated Overhead Block, the Address Register 920 (FIG. 9) of the Space Manager 900 is updated. As noted previously, according to the "block-embodiment," the space manager preferably includes both a VPBA field 922 and a Address Specifier 924 comprising a page number, although certain embodiments are envisioned wherein the address specifier 924 within the Space Manager 900 might be eliminated.

It is noted that FIG. 11 depicts different pages 1020, . . . , 926 at different stages of filling. This non-uniform filling of pages occurs when Virtual Logical Block Addresses are not assigned to incoming data at a uniform frequency, but rather, a single VLBA is repeated more frequently. When some VLBA's are assigned more frequently than others, a Dedicated Overhead Block will have to be consolidated and erased as soon as any single Overhead Page within that Overhead Block is filled, resulting in many unused Overhead Segments 1080 at the time of consolidation and erasure. The more unused overhead segments 1080 (FIG. 11) that exist at the time of a consolidation erasure, the more frequently a Dedicated Overhead Block must be cycled through an erase cycle.

Figure 12:
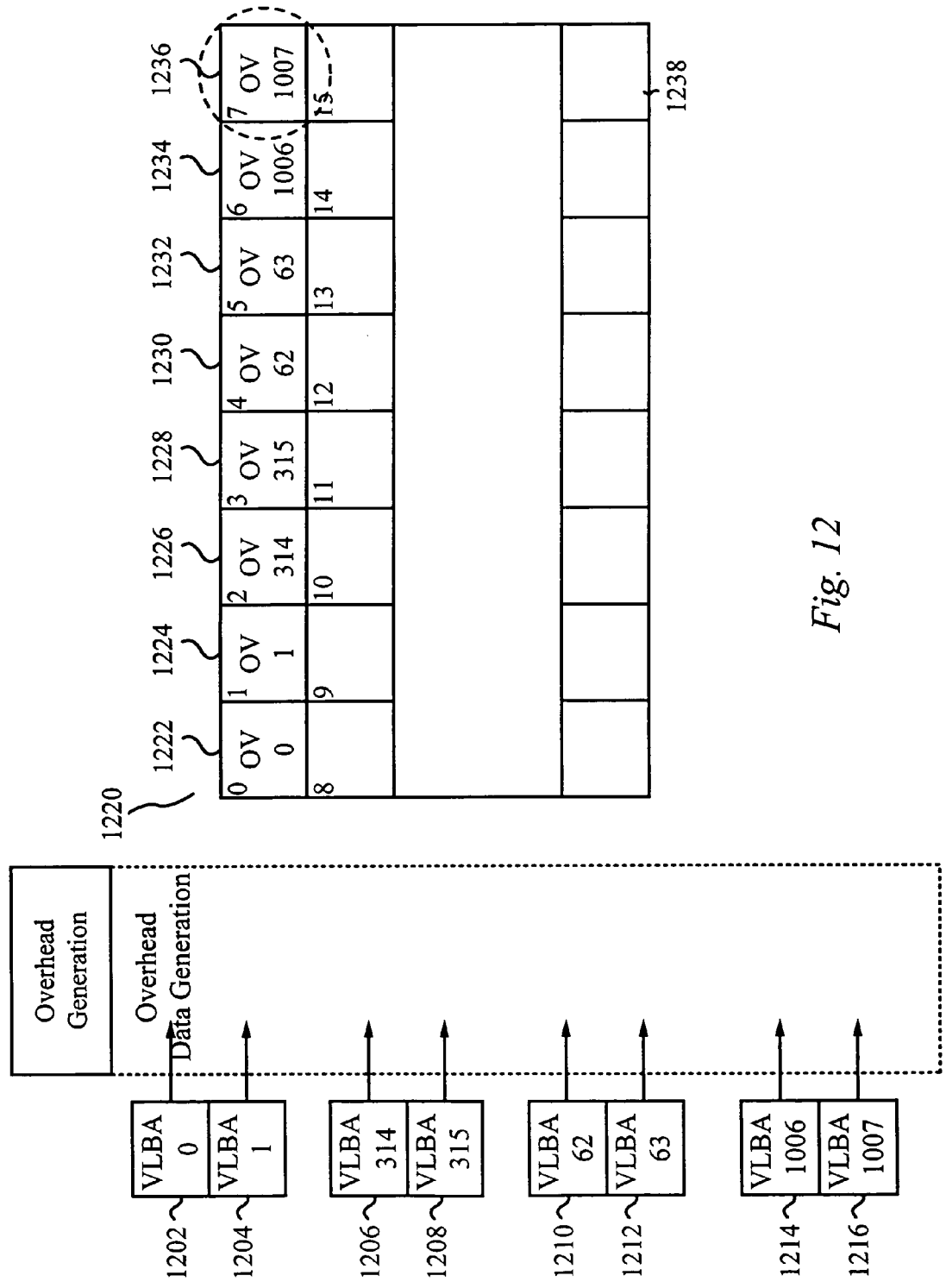
FIG. 12 shows the storage of overhead data according to the "random" embodiment.

FIG. 12 depicts the "random embodiment" of the present invention. Overhead Data relating to the incoming User Data 1202, . . . , 1216 are represented by "OV" plus the VLBA. For example, Overhead Data supporting "VLBA 314" 1206 is represented as "OV-314" 1226." According to the random-embodiment, an Overhead Page is not dedicated to a specific VLBA as in the block-embodiment previously discussed. Rather, as User Data defined according to a VLBA is received from the Host, Overhead Data generated in support of that User Data is stored in the next available segment of the Dedicated Overhead Block. Sequentially received VLB's of User Data 1202, . . . , 1206 produce sequentially generated sets of Overhead Data which are stored in consecutively addressed Overhead Segments 1222, . . . , 1238 regardless of the VLBA defining the incoming data. FIG. 12 illustrates four incoming data files, each data file comprising two Virtual Logical Blocks of data 1202 & 1204, 1206 & 1208, 1210 & 1212, and 1214 & 1216. The arrangement of incoming data is for exemplary purposes only; incoming data files are not limited to two VLBA's per file, nor must incoming files be uniform in size. The Overhead Data supporting this incoming data is seen stored in consecutively addressed Overhead Segments 1222, . . . 1236 of the Dedicated Overhead Block 1220 according to the order in which the User Data 1202, . . . 1216 was received.

According to the random embodiment, the VPBA register 922 of the Space Manager 900 (FIG. 9) defines the Virtual Physical Block Address of the Dedicated Overhead Block 1220, and the Address Specifier 924 must identify the exact segment. According to a random embodiment, however, the grouping of overhead segments 810, . . . , 822 into overhead pages 802, . . . , 806 (FIG. 8) is optional. Individual overhead segments 1222, . . . , 1236 (FIG. 12) may be addressed within the Address Specifier 924 by a page number and segment number within the page, or simply according to the total segment number within the Dedicated Overhead Block. In binary format, these two address formats may be indistinguishable. Whether or not a Dedicated Overhead Block is conceptually divided into pages, segments are regarded as consecutively addressable. If a Dedicated Overhead Block is conceptually divided into pages, the last segment of page five and the first segment of page six are considered consecutively addressed segments. Because the Address Specifier 924 according to the block embodiment of the present invention needed only to store the Overhead Page Number, the number of bits actually used for addressing in the Address Specifier will be greater in the random embodiment of the present invention than the block embodiment of the present invention.

Figure 13:
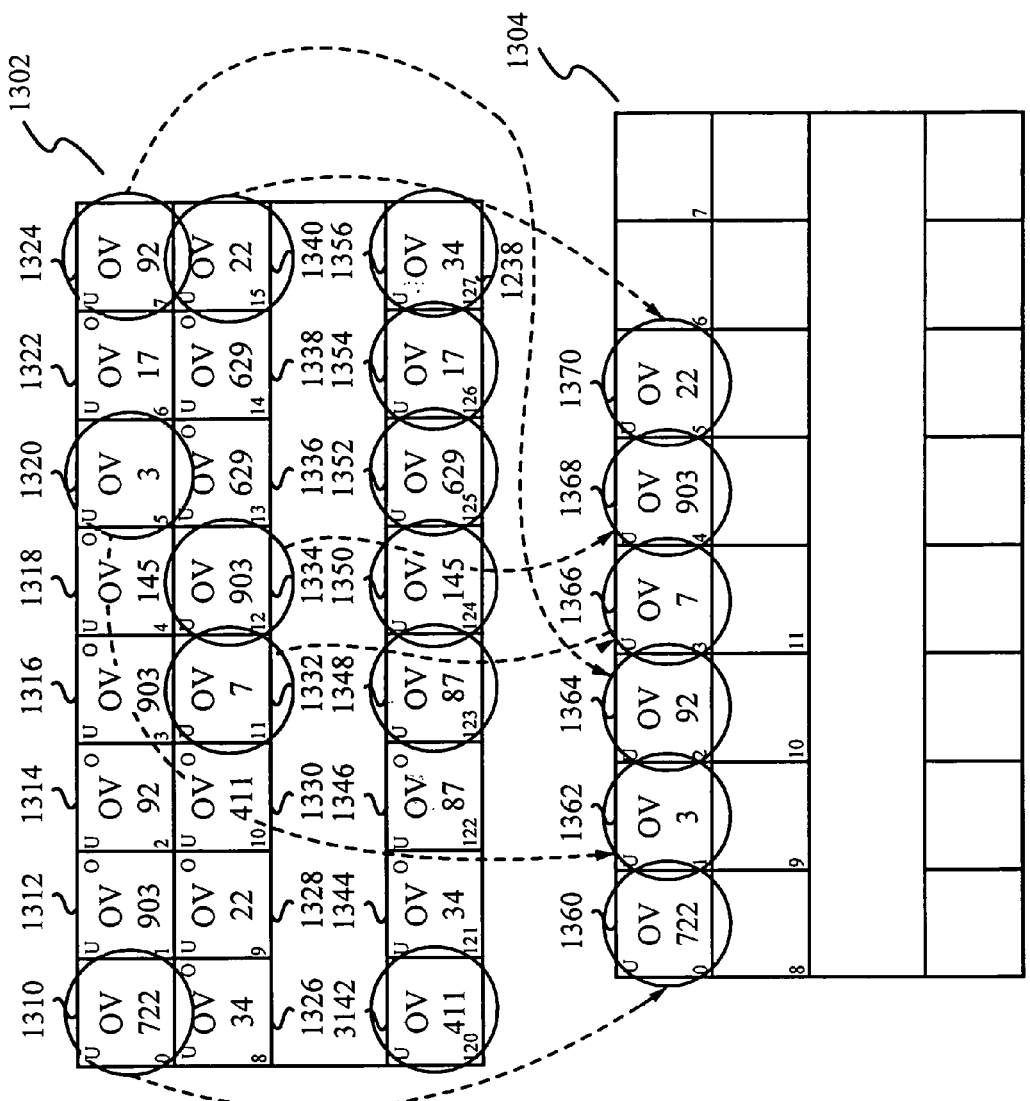
FIG. 13 the consolidation of all current sectors into a new Dedicated Overhead Block.

The consolidation of a Dedicated Overhead Block according to the random embodiment occurs when the last or final Overhead Segment 1238 is filled with overhead data. In the random-embodiment, current Overhead Segments and obsolete Overhead Segments are intermingled. FIG. 13 depicts a full Dedicated Overhead Block 1302 being consolidated into an available Dedicated Overhead Block 1304. Each segment 1310, . . . , 1356 discloses a "U" illustrating a "used-flag" in the second position. Select Overhead Segments display an "O" indicating that the "obsolete-flag" has been set. If a segment is not used and not defective, it is available. If a segment is Used but not Obsolete, it is current. For example, Overhead Segment 127 1356 is seen to contain Overhead Data Supporting VLBA 34, the overhead Data designated "OV-34." The "used flag" is seen set. Overhead Segment 121 1344 and Overhead Segment 8 1326 are seen to also contain overhead Data for VLBA 34, but display a "obsolete-flag" symbol. Each VLBA 34 was updated, the Overhead Data was updated, including new cross reference to where the new data was stored. Any update of any VLB was stored in the next available overhead segment 1310, . . . , 1356. Only the most recent update of "OV-34", seen to occur in Overhead Segment 127 1356 is current. The consolidation process for the random method is depicted in FIG. 13, where current (non-obsolete) Overhead Segments visibly identified by circles within the full Dedicated Overhead Block are in the process of being moved to the new Dedicated Overhead Block 1304. When all the current Overhead Data has been moved to the new Dedicated Overhead Block 1304, the obsolete Dedicated Overhead Block 1302 is erased. The erasure may be performed immediately, or the obsolete Block 1302 may be tagged for erasure and erased at a more convenient time.

Figure 14:
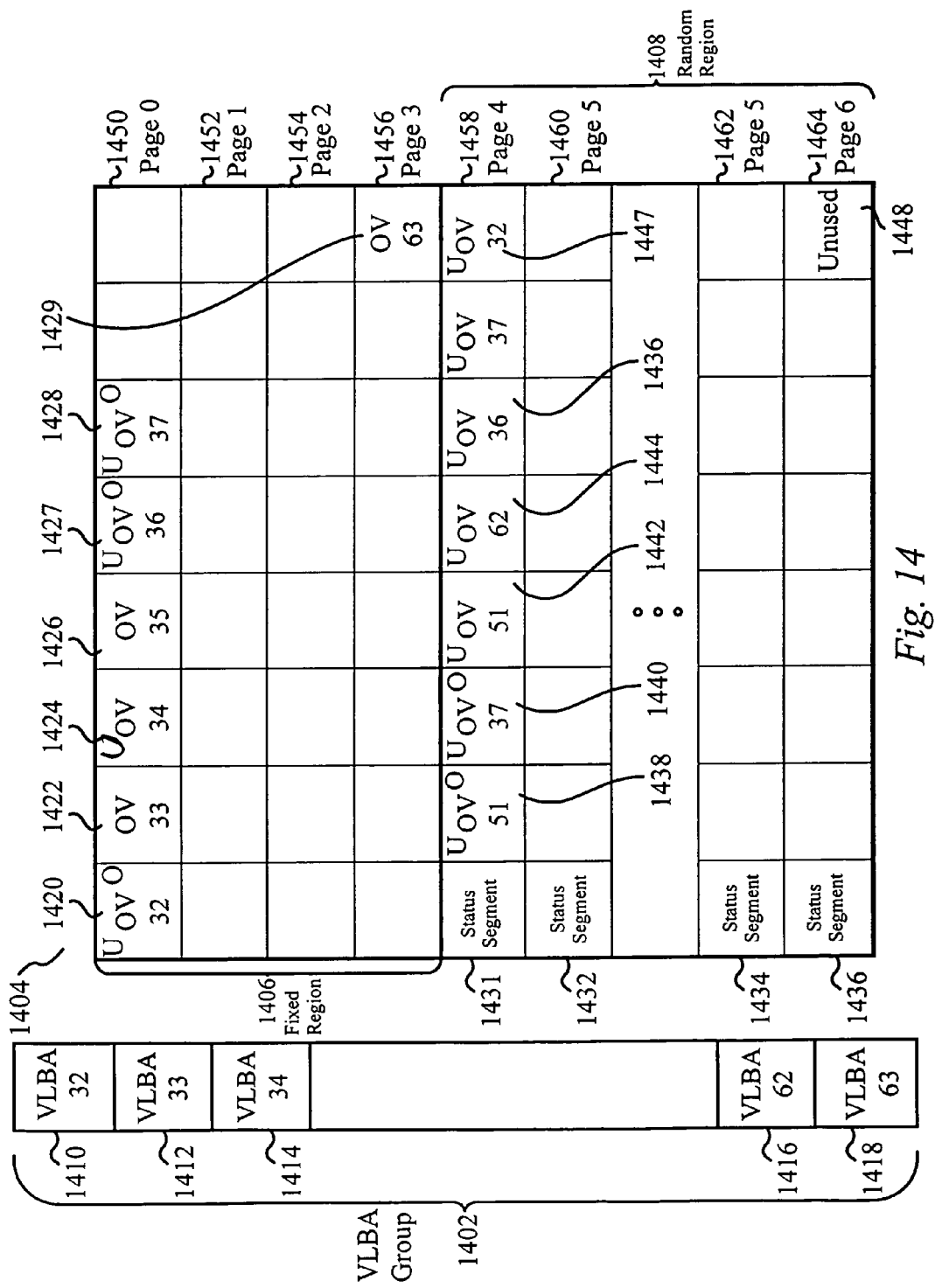
FIG. 14 shows the storage of overhead data according to the "hybrid" embodiment.

FIG. 14 discloses a Flash Memory arrangement according to the hybrid embodiment. Because a system user may not know which of these embodiments will be most efficient, as affected by, potential variations in the frequency of VLBA repetition, the hybrid-embodiment of the present invention offers a system that maintains roughly the same level of efficiency regardless of the frequency of reassignment of VLBA's to incoming data. The hybrid embodiment of the present invention comprises a dedicated overhead block 1404 FIG. 14 with a fixed overhead field 1406 and a random overhead field 1408. Available VLBA addresses 902, . . . , 912 (FIG. 9) are conceptually divided into a plurality of groups, such as the group 1402 illustrated in FIG. 14. Each group, e.g. 1402, is defined by a plurality of consecutive VLBA's 1410, . . . , 1418. Preferably, the groups are equal in length.

Consecutive VLBA's 1410, . . . , 1418 within a VLBA group 1402 are correlated to consecutive overhead segments 1420, . . . , 1429 within the fixed overhead field 1406 of a Dedicated Overhead Block 1404. The fixed overhead field 1406 of a Dedicated Overhead Block 1404 preferably comprises a number of overhead segments 1420, . . . , 1429 equal to the number of VLBA's 1410, . . . , 1418 in a VLBA group 1402. If the total number of VLBA's within a flash memory system are not evenly divisible into a plurality of fixed overhead fields corresponding to a plurality of dedicated overhead blocks, according to the preferred embodiment, all but the final group would advantageously have a number of VLBA's equal to the number of segments 1420, . . . , 1429 within a Fixed overhead field 1406, and the final group of VLBA's would contain fewer VLBA's 1410, . . . , 1418 than the number of segments 1420, . . . , 1429 in a Fixed overhead field 1406 of a dedicated overhead block.

FIG. 14 depicts an exemplary VLBA group 1402 of thirty two VLBA's 1410, . . . , 1418 which are correlated to thirty-two segments 1420, . . . , 1429 within the Fixed overhead field 1406 of the Dedicated Overhead Block 1404. The thirty-two segments are seen to be divided among four pages 1450, . . . , 1456. Ninety-six segments 1431, . . . 1448 within the Random overhead field 1408 are seen to be divided among twelve pages 1458, . . . , 1464. It is understood that these numbers are for exemplary purposes only, and that a group of VLBA's could be larger or smaller, that there could be greater or fewer segments per Dedicated Overhead Block, etc. It is also understood that the ratio of one quarter of a Dedicated Overhead Block 1404 being reserved to a Fixed overhead field 1406 and three quarters of the block 1404 being reserved for the Random overhead field 1408 is not a fixed ratio. According to the preferred embodiment, however, less than half of a dedicated overhead block will be set aside as the fixed overhead field. In FIG. 14, only four segments 1438, . . . 1444 of the random overhead field have been used for storage of overhead data. As noted in conjunction with FIG. 8B, each segment will advantageously comprise a flag field, including an used flag and an obsolete flag. As will be discussed in greater detail in conjunction with FIG. 16, Overhead Segments within the random overhead field are not pre-assigned to specific VLBA's. The Overhead Segments according to the Hybrid embodiment will advantageously comprise a Physical Address Register for correlating the overhead data to the user data. When used in conjunction with the Hybrid Embodiment, the Space Manager 900 of FIG. 9 will preferably reference the address of the Dedicated Overhead Block in the VBPA register, and fixed Overhead Segment address within the Address Specifier 924.

In FIG. 14, the flag status of select segments 1420 through 1428 and 1438 through 1444 are illustrated by the presence or absence of U for "used" and O for "obsolete." Overhead Segment 32 1420 representing VLBA 32 1410 and Overhead Segment 36 1426 representing VLBA 36 display a used flag, but not an obsolete flag. They therefore contain current overhead data. Overhead Segments 33 1422, 34 1424 and 35 1426 display no "used" flag, and therefore, have not yet been used to store overhead data. Overhead Segment 37 1428 displays both an used flag and an obsolete flag, indicating that VLBA 37 was updated with new data, thereby generating new overhead data which was subsequently stored in a segment 1440 the random overhead field 1408. A more detailed discussion of storage of overhead data according to the hybrid-embodiment will be discussed in conjunction with FIG. 16.

According to the preferred embodiment of the hybrid method, the first segment 1431, . . . , 1436 of each page 1458, . . . 1464 within the random overhead field 1408 is a Status Segment which contains an Update Map. According to the preferred embodiment, this advantageously comprises data for locating the current segment corresponding to each VLBA in the VLBA group 1402.

Figure 15:
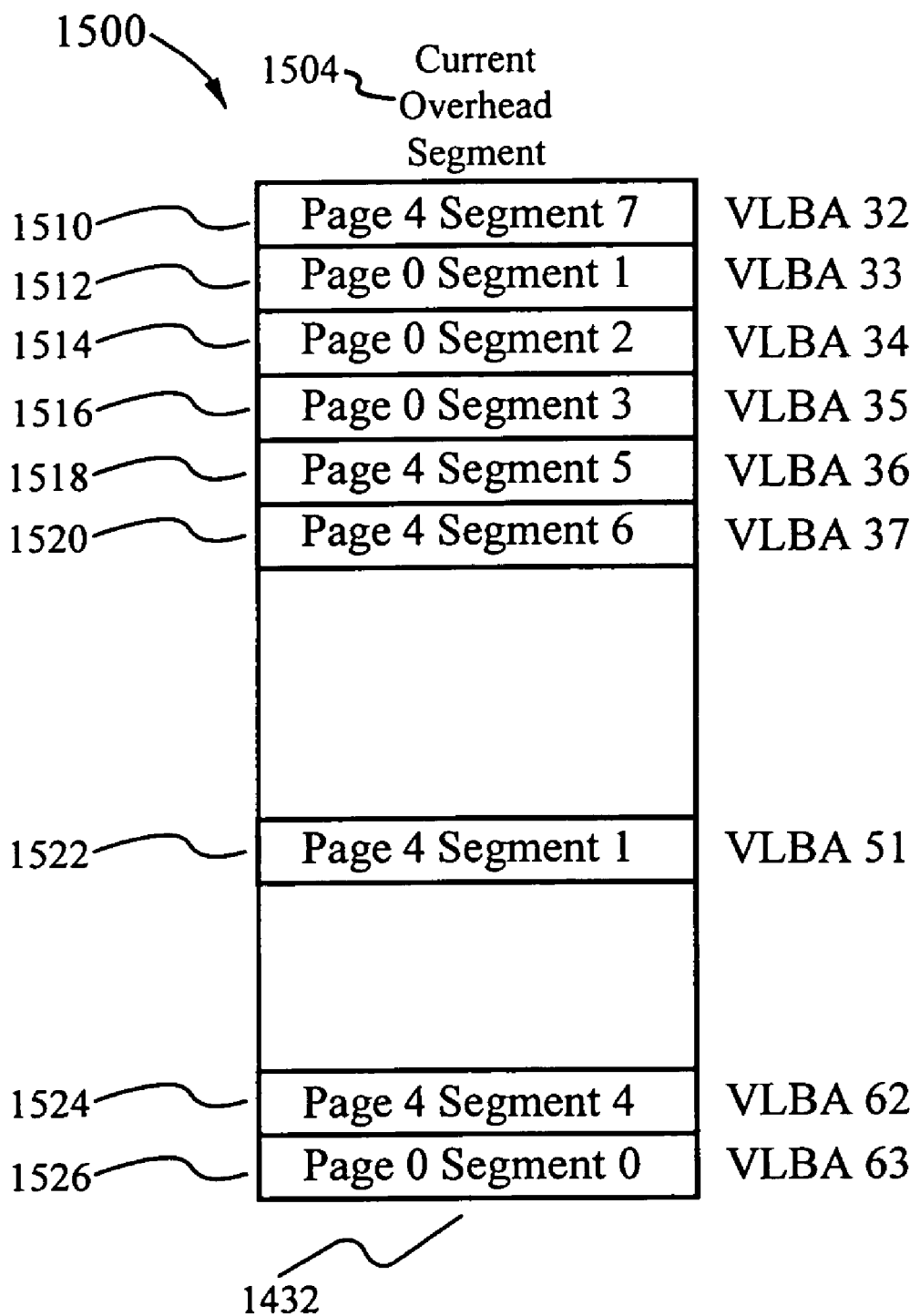
FIG. 15 shows one embodiment of the structure of an overhead segment according to the hybrid embodiment.

FIG. 15 depicts one embodiment of an Update Map within a status segment, using for exemplary purposes the status segment 1431 of the first page 1458 of the random overhead field 1408. According to the embodiment of FIG. 15, an Update Map comprises a number of registers 1510, . . . , 1526 equal in number to the number of segments in the fixed overhead field 1406. As noted, consecutive registers within the Update Map are related to the consecutive VLBA's related to the consecutive segments within the fixed overhead field 1406. While not intended to limit the storage of data in a Update Map, FIG. 15 shows a page number and segment number present in a field related to a particular VLBA. Although the embodiment depicted in FIG. 14 does not include Update Maps within the fixed region 1406, according to the embodiment of the Update Map 1500 (FIG. 15) within the Status Segment 1432 of page 5 (FIG. 14), the Update Map will locate all current overhead segments, whether in the fixed region 1406, or in the random region 1408 occurring in any page 1450, . . . , 1458 prior to the page 1460 in which the status segment 1432 is found. For example, examining FIG. 14 in conjunction with FIG. 15, a current (non-obsolete) overhead segment 1447 supporting overhead data for VLBA 32 is found in segment 7 1447 of page 4 1458. The Update Map 1500 of FIG. 15, located in the Status Segment 1432 of next page 1460 reflects this address, "page 4 segment 7" in the register 1510 corresponding to VLBA 32. Within the fixed region 1406, the current overhead segment 1424 related to VLBA 34 is found in sector 2 of page 0. Turning again to FIG. 15, this address is reflected in the register 1514 related to VLBA 34. Accordingly, a Status Segment 1431, . . . , 1436 is designed to locate any current overhead segments within its Dedicated Overhead Block from any pages preceding the page in which the Status Segment 1431, . . . 1436 is located.

Figure 16:
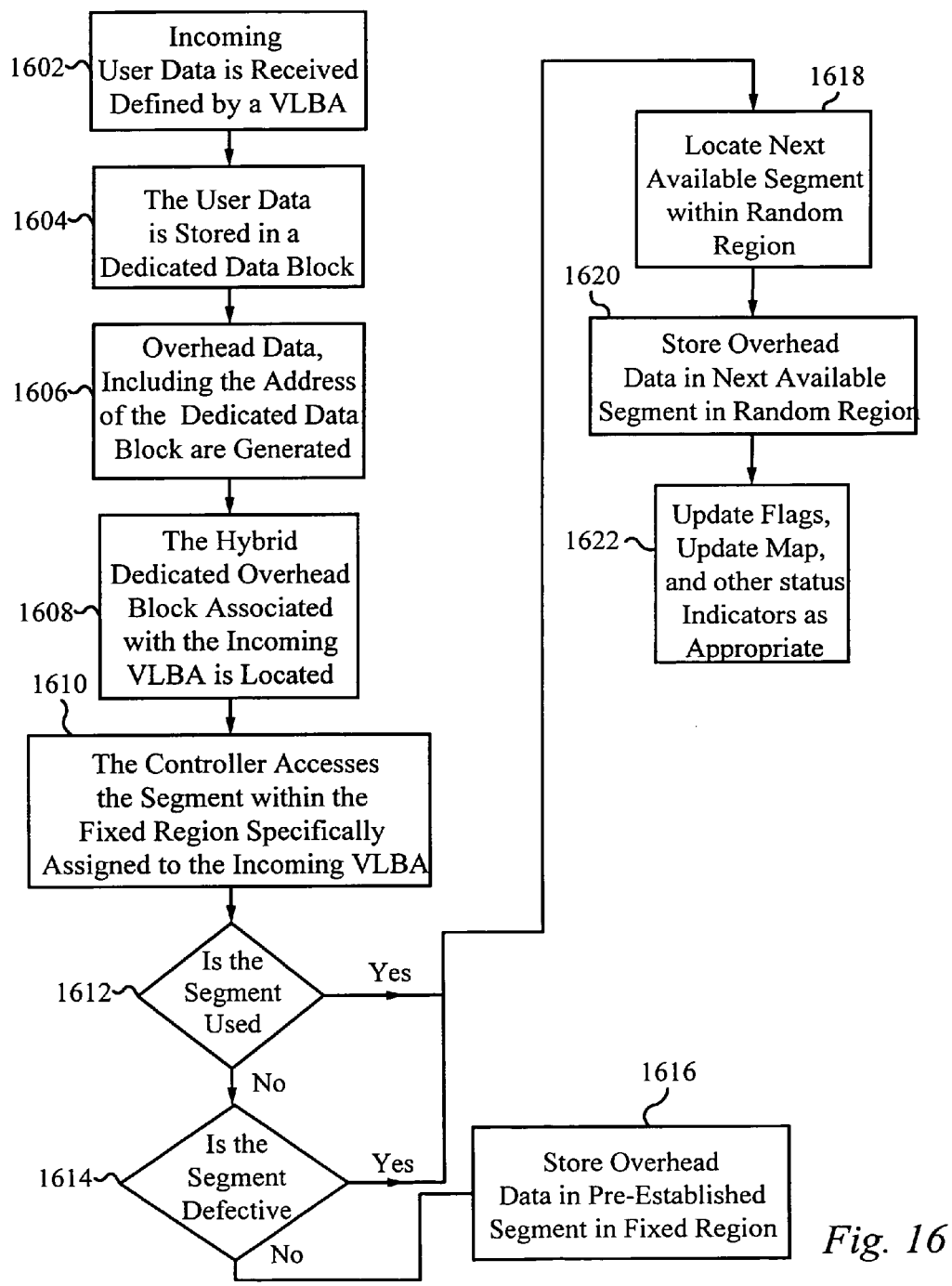
FIG. 16 is a flow chart of data storage according to the hybrid embodiment.

FIG. 16 shows a sequence of storing overhead data in a Dedicated Overhead Block according to the hybrid embodiment of the present invention. In the step 1602, incoming user data is received which is defined by a VLBA. For illustrative purposes, the VLBA group 1402 and Dedicated Overhead Block 1404 of FIG. 14 are considered in conjunction with the process disclosed in FIG. 16. According to the step 1604, the incoming data is stored in a Dedicated Data Block. In the step 1606 the overhead data associated with the incoming data is generated. This will necessarily include a cross reference of the VPBA where the data has been stored. In the step 1608 the Dedicated Overhead Block 1404 correlated to the incoming VLBA is located. In the step 1610, the controller accesses the specific segment 1420, . . . 1429 in the fixed overhead field 1306 that has been correlated with the incoming VLBA. The controller then examines the segment to determine if it is used according to the step 1612 or defective according to the step 1614. If the segment is unused and non-defective, according to the step 1616, the overhead data is stored in the specific segment 1420, . . . , 1429 within the fixed overhead field 1406 that has been pre-established to correlate to the incoming VLBA. If the pre-established overhead segment within the fixed overhead field 1406 is either used according to the step 1612, of defective according to the step 1614, the controller locates the next available Overhead Segment within the random overhead field according to step 1618. The term "next available" is used herein in its most natural sense, referring to a segment that is unused and non-defective within the random overhead field whose segment address incrementally follows the last used segment within the random overhead field. It is understood that unused but defective segments are skipped over in this process. Additionally, it is understood that, in an embodiment of the hybrid method wherein status segments occupy the first segment of each page, such status segments are also skipped-over in incrementing to the "next available" segment for the storage of overhead information. Although segment addresses within the random overhead field 1408 may simply be regarded as consecutive segment addresses, the mapping of the random overhead field will advantageously include pages. According to this addressing scheme, those skilled in the art will understand that the last addressable segment in page "n" is followed by the first addressable segment in page "n+1". It is understood that variations of the present algorithm are possible, and that the algorithm of FIG. 16 is not intended to limit the means by which the correct overhead segment is selected in the hybrid embodiment of the present invention. Specifically with respect to steps 1610 through 1618, the determination of the first available segment, whether it be the pre-designated segment in the fixed overhead field 1406 or the next available segment within the random overhead field 1408, the process need not include the examination of flags within actual overhead segments. As discussed in conjunction with FIG. 15, an update map 1500 within a status segment 1431 of the random region 1408 may be configured to reflect the status of overhead segments in the fixed region 1406 as well as the random region 1408. Alternatively, the status of overhead segments 1420, . . . , 1429 within the fixed region 1406 could be stored in the extension field at the end of each page, illustrated in FIG. 2 of the prior art, and again in FIGS. 18 & 19 which discuss alternative embodiments of the present invention. Flags may be used in the extension field of each page in the fixed overhead field 1406 to indicate whether various segments within each page 1450, . . . , 1456 have been used. Accordingly, steps 1610 through 1618 of FIG. 16 are intended only as an example of one way in which an available segment is selected.

Returning to FIG. 16, according to the step 1620, after locating the next available segment within the random overhead field 1408, the controller stores the overhead data in that segment. In the step 1622, the controller updates status segments and flags as appropriate. This may variously include the flags 1504, 1508, 1509 in the status segments 1431, . . . , 1436 as well as the flags in the actual overhead segments 1438, . . . , 1448. This will advantageously include locating the last previous segment which was used to store Overhead Data associated with the incoming VLBA and setting an obsolete flag in conjunction with it. The flag update should also include setting a used-flag in conjunction with the Overhead Segment in which overhead data is presently being stored.

An examination of FIG. 14 discloses that four segments within the random overhead field have been filled. The first segment 1438 displays overhead data supporting VLBA 51. Flags within the Overhead Segment 1438 indicate that it is used and obsolete. According to the process disclosed in conjunction with FIG. 16, the fact that overhead for VLBA 51 has been stored in the random overhead field 1408 indicates that overhead data had already been stored in the fixed overhead field 1406 corresponding to VLBA 51. The presence of an obsolete flag indicates that overhead data supporting VLBA 51 has been updated since storage of overhead data in overhead segment 1438 of the random overhead field 1408. This updated overhead data is seen in the third overhead segment 1442. From this illustration, it is seen that overhead data supporting a specific VLBA can be stored only once in the fixed overhead field 1406, but may be repeated multiple times in the random overhead field 1408.

According to the preferred embodiment, a status segment 1431, . . . , 1436 is placed in the first segment of each page 1458, . . . , 1464 within the random overhead field 1408. The status segments will advantageously be used reduce the time expended by the controller in retrieving data by assisting the controller to more efficiently locate a most recent overhead update of a particular VLBA. Similarly, in the process of storing new overhead data supporting a particular VLBA, according to the preferred embodiment, the controller will advantageously locate the last segment of overhead data supporting that VLBA and set the obsolete flag to a second position. Again, this process can be made more efficient by examining status segments 1431, . . . , 1436. Another operation in which the status segments may increase efficiency of a flash memory system is the consolidation process of a Dedicated Overhead Block utilizing the hybrid method. According to the consolidation process discussed below, the controller locates all current segments and transfers them a new dedicated overhead block. In locating current segments to perform the consolidation, the controller will operate more efficiently by limiting its search to the fixed overhead field and the status segments at the beginning of each page.

Figure 17:
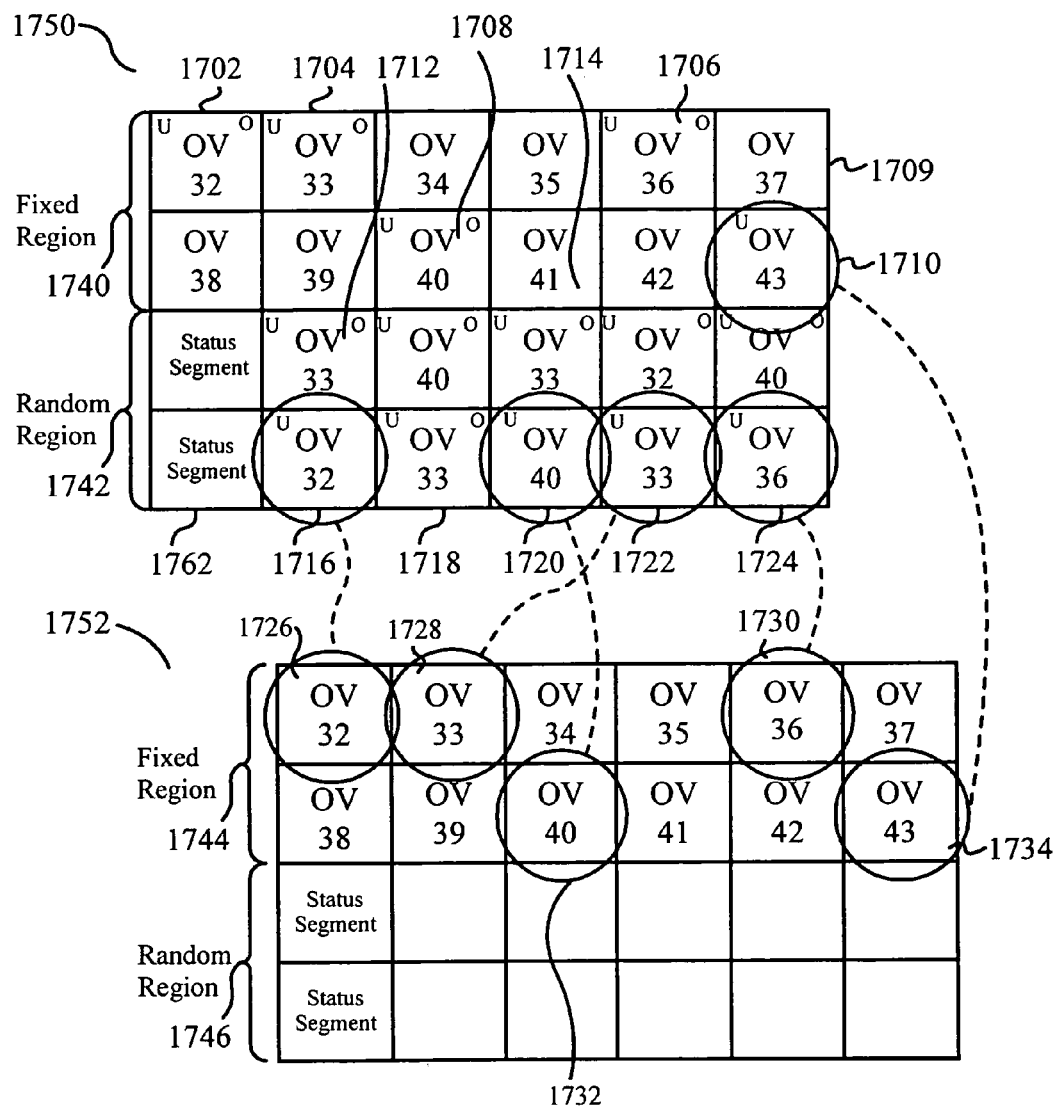
FIG. 17 is an illustration of consolidation of a "full" Dedicated Overhead Block into a new Dedicated Overhead Block according to the hybrid embodiment.

FIG. 17 illustrates the consolidation process according to the hybrid method, consolidating a full Dedicated Overhead Block 1750 into a free Dedicated Overhead Block 1752. For ease of illustration only, each block comprises a fixed overhead field of two pages, and a random overhead field of two pages, each page comprising six segments. Five of the ten overhead segments in the fix region 1740 of the full Dedicated Overhead Block have a "U" symbolizing a "used flag" in the second position, indicating that overhead data has been stored in them. Using the notation "OV-32" to represent overhead data for VLBA 32, segments in the fixed overhead field which have received overhead data are OV-32 1702, OV-33 1704, OV-36 1706, OV-40 1708 and OV-43 1710. The remaining five segments, such as OV-37 1709 have no "used-flag," thereby indicating that no overhead data has been stored in them. If an incoming VLB of user data defined by VLBA 37 were received next, there exists an empty overhead segment 1709 pre-designated to store overhead data supporting VLBA 37. However, if the next set of incoming data were defined by VLBA 33, the pre-designated segment 1704 for OV-33 within the fixed overhead field has already been used, and no unused segments remain in the random overhead field 1742. Accordingly, the Dedicated Overhead Block 1750 is defined as "full" and consolidated when the last segment 1724 of the random overhead field 1742 becomes full.

Of the segments that have received overhead data, only the last segment to receive data for a specific VLBA is current and used in the consolidation process. For example, OV-33, overhead data supporting VLBA 33 has been stored in a variety of overhead segments 1704, 1712, 1714, 1718 and 1722. Among these segments, however, only the last addressable segment 1722 is current. The other segments successively became obsolete when VLBA 33 was updated, with a corresponding update of OV-33.

In FIG. 17, five segments 1717, 1722, 1724, 1720 and 1710 respectively storing overhead data OV-32, OV-33, OV-36, OV-40 and OV-43 are current, as highlighted by circling. Because the last segment 1724 within the random overhead field 1742 has been fulled, the entire Dedicated Overhead Block 1750 is full, and must be consolidated. In the consolidation process, overhead data OV-32, OV-33, OV-36, OV-40 and OV-43 from each of the current segments 1717, 1722, 1724, 1720 and 1710 is stored in its respective pre-determined segment 1726, 1728, 1730, 1732, 1734 within the fixed overhead field 1744 of the new Dedicated Overhead Block 1752, as indicated by the dotted lines. To expedite the consolidation process, the controller will preferably limit its search the flags within the Fixed overhead field 1740 and flags within the status segments 1760, 1762. Additional features relating to data storage, data retrieval, overhead block consolidation and power up procedures using the hybrid method will be readily apparent to those skilled in the art.

Figure 18:
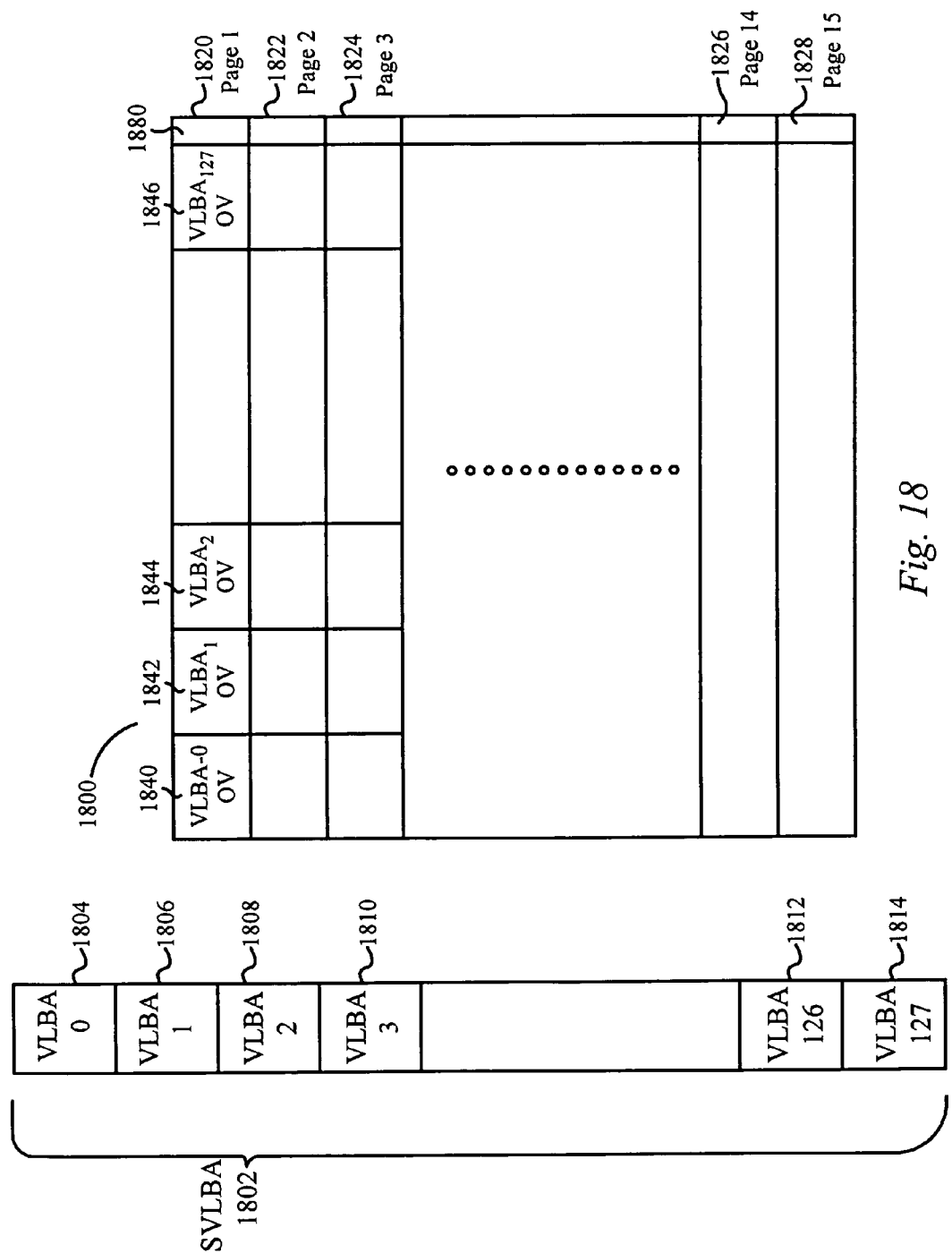
FIG. 18 illustrates the structure and correlation of a Dedicated Overhead Block according to the "SuperBlock" embodiment.
Figure 19:
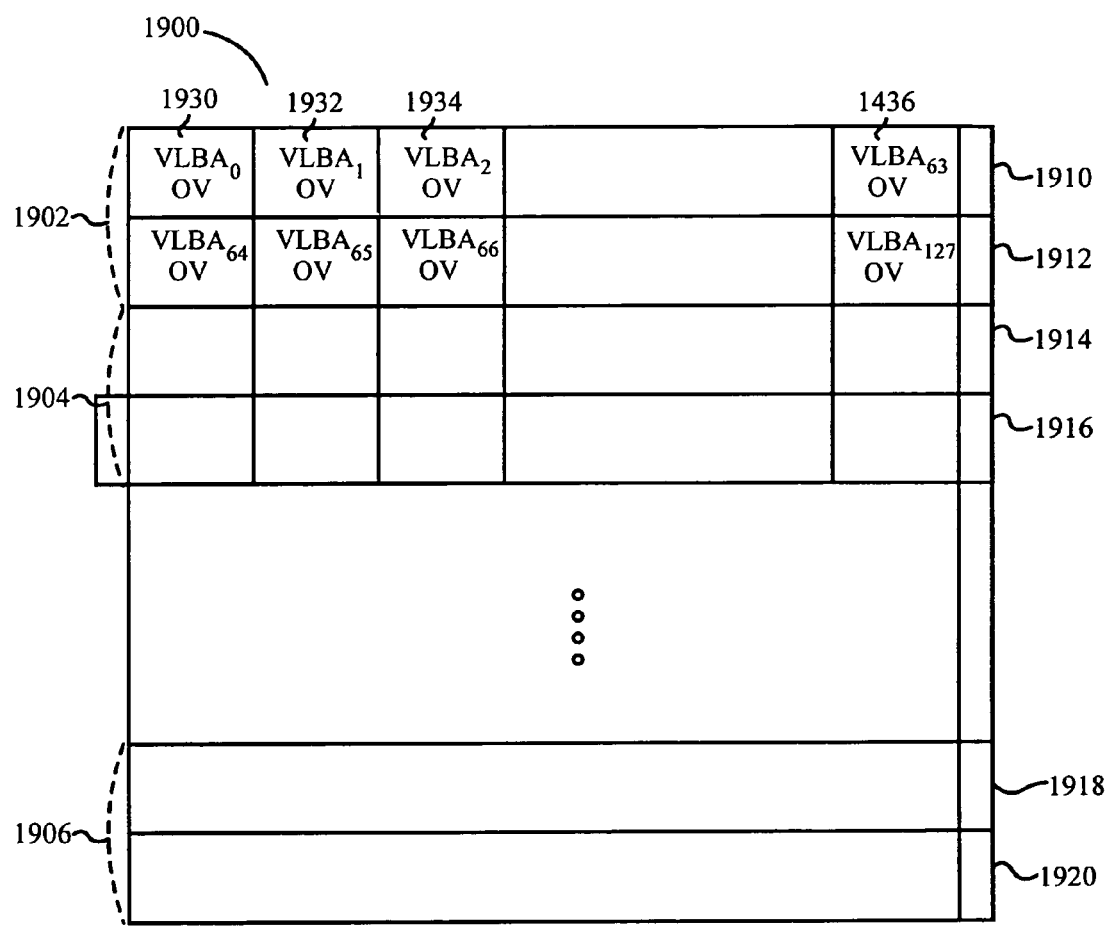
FIG. 19 illustrates a SuperBlock embodiment with multiple pages comprising each Super Overhead Field.

The "SuperBlock" embodiment of the present invention is disclosed in FIG. 18. Certain features of the SuperBlock embodiment can be advantageously illustrated by comparing them to certain features to the hybrid embodiment. It will be recalled that, according to the hybrid embodiment, specific Overhead Segments 1420, . . . 1429 within a Dedicated Overhead Block 1404 were individually pre-designated to store overhead data supporting a specific Virtual Logical Block of user data from among a group 1402 of VLB's 1410, . . . , 1418. Similarly, according to the SuperBlock embodiment, a Super Overhead Field 1820, . . . , 1820 comprising specific Overhead Segments 1840, . . . 1846 within a Dedicated Overhead Block 1800 are pre-designated to store overhead data supporting a specific Virtual Logical Block of user data from among a group or "Super Virtual Logical Block" (SVLB) 1802 comprising multiple Virtual Logical Blocks 1804, . . . , 1814 of user data. According to the hybrid embodiment, the field containing the pre-designated Overhead Segments was a "fixed overhead field" which was depicting as comprising four pages in FIG. 14, and two Overhead Pages in FIG. 17. According to FIG. 18, the Super Overhead Field containing pre-designated Overhead Segments is seen to be a single page 1820. However, the SuperBlock embodiment envisions the possibility of distributing the pre-designated Overhead Segments among multiple pages. FIG. 19 displays Super Overhead Fields 1902, . . . , 1906 comprising two overhead pages each 1910 & 1912, . . . , 1918 & 1920. Accordingly, a Super Overhead Field may comprise a single page 1820, or a plurality of pages 1910 & 1912. The distinction between the Fixed overhead field 1406 in the hybrid embodiment and a Super Overhead Field 1902 however, is more than simply nominal. There is only one fixed overhead field 1406 within a Dedicated Overhead Block 1404 according to the hybrid embodiment, whereas there are multiple Super Overhead Fields 1902, . . . , 1906 within a Dedicated Overhead Block 1900 according to the SuperBlock embodiment. Although an SVLB 1802 may comprise any number of any number of VLB's, with a corresponding number of pre-designated Overhead Segments 1840, . . . , 1846 in each Super Overhead Field, those skilled in the art will recognize that the number of VLB's 1804, . . . , 1814 in a SVLB 1802 will advantageously be a power of two. Because many advantages of the SuperBlock embodiment substantially diminished when the number of Overhead Segments comprising a Super Overhead Field is small, an Overhead SuperBlock will preferably comprise sixty-four or one hundred twenty-eight Overhead Segments. FIGS. 18 and 19 are both depicted with Overhead SuperBlocks comprising one hundred-twenty eight Overhead segments.

It is recalled that, according to a standard size block and page, ECC Design-One, which included no error correction capability within an Overhead Segment, resulted in an Overhead Page comprising one hundred twenty-eight Overhead Segments, and ECC Design-Two, which included a simple parity check within an Overhead Segment, yielded an Overhead Page comprising sixty four Overhead Segments. FIG. 18, with one hundred twenty-eight Overhead Segments 1840, . . . 1846 comprising a Super Overhead Field distributed in a single page 1820 is an example of utilizing ECC Design-one. In contrast, FIG. 19 discloses a Super Overhead Field 1902 comprising two pages 1910, 1912 of sixty-four Overhead Segments each. Sixty-four overhead segments per page is an example of ECC Design-two. It can be seen according to FIGS. 18 and 19 that in order to efficiently pack large numbers of Super Overhead Fields 1902, . . . 1906 into a single Dedicated Overhead Block 1900, ECC Design-one, ECC Design-two and ECC Design-three are the preferred error correction designs for use in the SuperBlock embodiment. On skilled in the art will understand that, just as ECC Design-two required two pages per Super Overhead Field 1902, in a SuperBlock application incorporating ECC Design-three, a Super Overhead Field would require multiple pages. Because ECC Design-three would allow only eight segments per page, sixteen pages would be required to support a Super Virtual Logical Block comprising a range of one hundred twenty eight VLBA's. Accordingly, it is envisioned that applications using ECC Design-three in conjunction with the superBlock method will decrease the range of VLBA's in a SVLB.

According to the preferred embodiment of the Super-Block embodiment, the VPBA register 922 of the Space Manager 900 (FIG. 9) references the VBPA of the Dedicated Overhead Block, which, according to the SuperBlock embodiment, is advantageously called a SVPBA. The Address Specifier 924 preferably references the page number 1820, . . . , 1828 currently in use in the Super Dedicated Overhead Block. In embodiments such as FIG. 19 wherein the pre-designated range 1902 of distinct Overhead Segments occupies multiple pages, according to the preferred embodiment, the Address Specifier 924 of the Space Manager 900 will reference all current pages. In addition to the Flags 930, . . . 934 disclosed in FIG. 9, according to the SuperBlock embodiment, the flag register 952 will advantageously include fields designating Move-Pending "MvP" and Move-Complete "MvC" not shown.

To facilitate the loading of the Space Manager on power up, a logical address must be referenced somewhere in the non-volatile flash memory. It will be recalled that according to both ECC Design-one and ECC Design-two, an Overhead Segment will be comprised of sufficient memory to reference a Virtual Logical Block Address. Alternatively, it is recalled that distinctly addressable pages 1820, . . . , 1828 according to the present invention represent a physical area of memory formerly designated as a sector 200 (FIG. 2) according to the prior art. Each sector was comprised a data area 202 of five hundred twelve bytes, and a sixteen byte Extension Field 204. The Overhead Segments 1840, . . . 1846 of the present invention occupy the same memory area formerly designated as the data area 202 of a sector. Accordingly, the Extension Field 204 of the prior art provides available memory area 1880 according to the present invention. According to the preferred embodiment, this extension field 1880 is used to store the Super Virtual Logical Block Address (SVLBA) of the Super Virtual Logical Block 1802 which corresponds to the Super Dedicated Overhead Block 1800. On power up, the information stored in the extension field 1880 is advantageously used to correlate logical and physical addresses within the space manager.

In order to limit the memory consumed by the RAM Space Manager 900 the Address Specifier 924 preferably limits its reference to the page level, allowing the controller to locate specific segments by a programmed algorithm. When a new VLB of user data defined according to an address within the SVLB 1802 is received, the controller increments to the next Super Overhead Field, which, in FIG. 19, wherein a Super Overhead Field 1902 is comprised of two pages 1910 & 1912, according to the preferred embodiment, the extension field in both pages will reference the SVLBA, and the Space Manager 900 will reference both pages of the Super Overhead Field.

Figure 20:
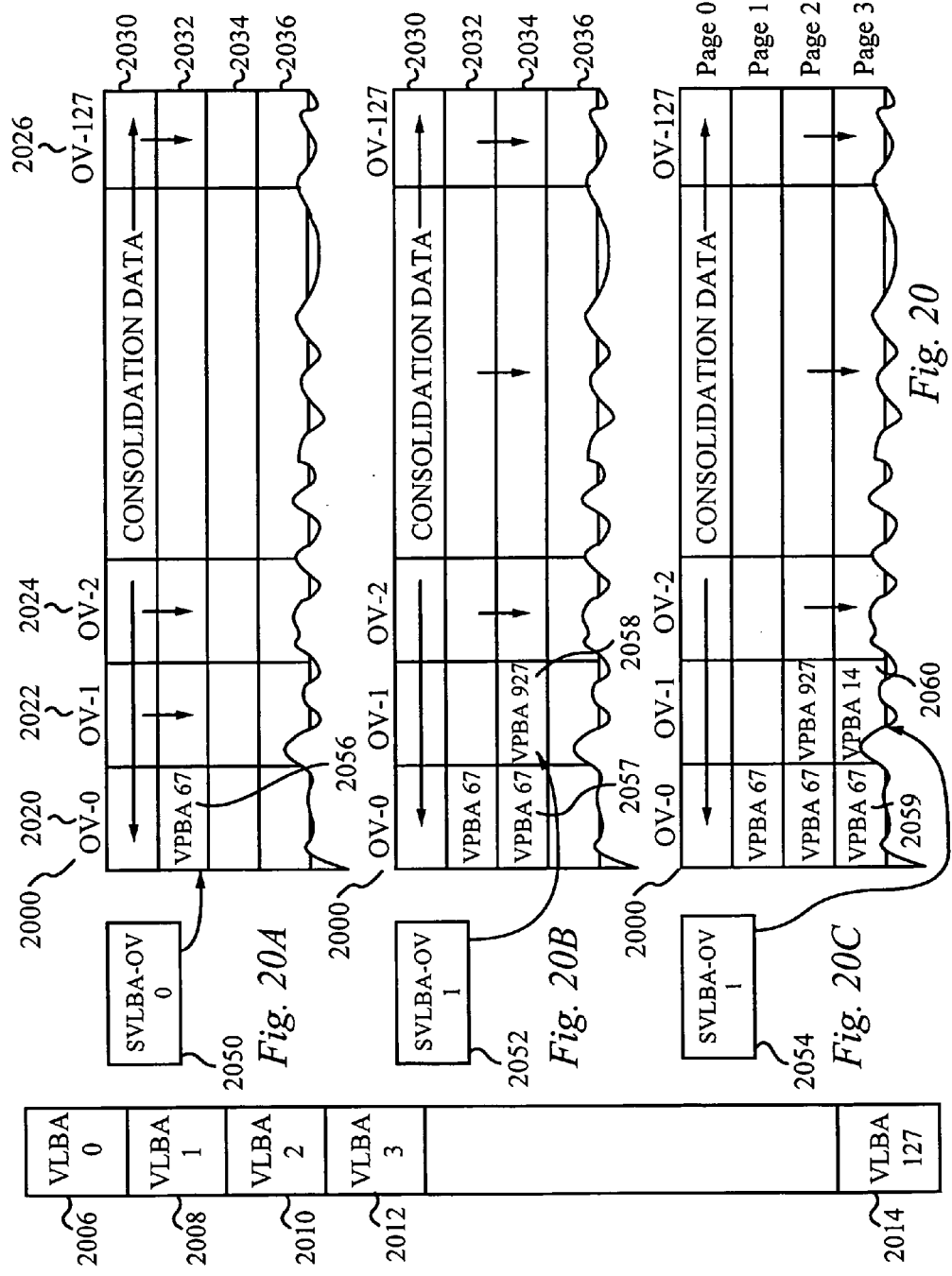
FIG. 20 illustrates the storage of overhead data according to the SuperBlock embodiment in a succession of three steps.

FIG. 20 depicts successive steps of storage of overhead data according to the SuperBlock embodiment. Segment columns 2020, . . . 2026 within a Super Dedicated Overhead Block 2000 are pre-correlated with consecutive VLBA's 2006, . . . , 2014 comprising the Super Virtual Logical Block 2004. According to the first step depicted in FIG. 20A, Overhead Data SVLBA-OV 0 2050 supporting VLBA 0 2006 has been generated and is being stored in Overhead Segment 0 2056 of Overhead Page One 2030 (which also comprises a single Super Overhead Field). The address stored in that segment 2056 has been arbitrarily chosen as VPBA 67 for exemplary purposes. Data from the previous page 2030 is also copied into the new page 2032, as indicated by the downward arrows. However, data is not copied from the previous page 2030 into the segment 2056 of the current page 2032 which is receiving new overhead data including a VPBA address.

In the second step, according to FIG. 20B, Overhead Data SVLBA-OV 1 2052 supporting VLBA 1 2008 has been generated and is being stored in Overhead Segment 1 2058 of Overhead Page 2 2034. For exemplary purposes, VPBA 927 is selected as the address stored in the new segment 2058. Again, it is noted that data from the previous page 2032 is stored in the new page 2034, as indicated by the downward arrows, and by the presence of VPBA 67 copied into the first segment 2057 of the new page 2034.

In the third step, according to FIG. 20C, Overhead Data SVLBA-OV 1 2054 is again generated to support an update of VLBA 1 2008. Again, data is copied from the previous page 2034 into the new page, as illustrated by the presence of VPBA 67 in the first segment 2059 of the new page 2036, and by the downward arrows. It is noted however that new overhead data 2054 is updating the data in the second Overhead Column 2022 which is used to store overhead data for VLBA 1. Accordingly, data is not copied from the previous segment 2058 into the new segment 2060 since incoming overhead data is being stored therein. This is illustrated by the fact that VPBA 907 is not copied into the new segment 2060 of the new page 2036, but VPBA 14, exemplifying the overhead generated from SVLBA OV 1 2054 on the third cycle. As illustrated by these three steps, data from the preceding page is copied into the new page, except for the segment receiving new overhead data.

Figure 21:
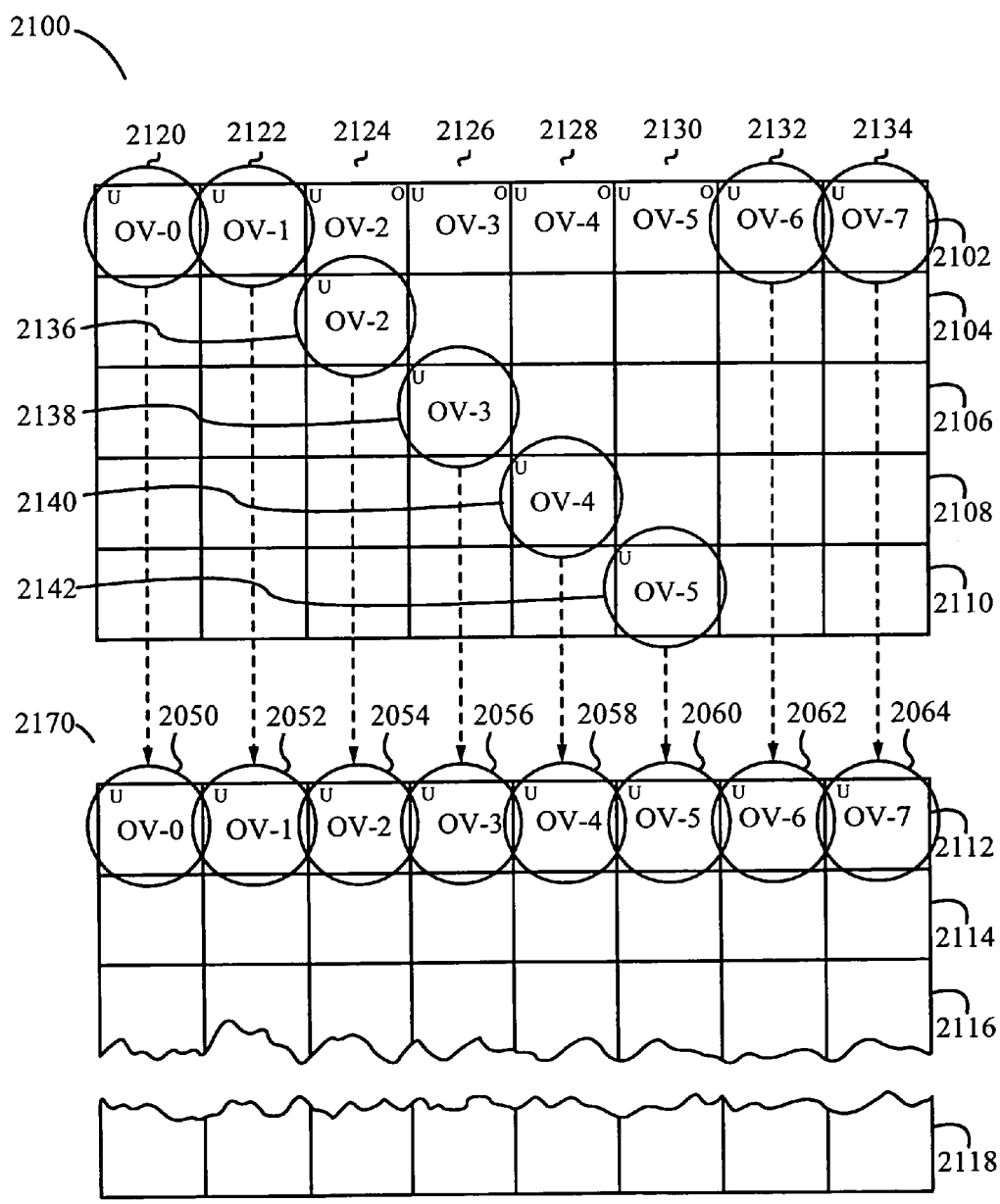
FIG. 21 illustrates the consolidation of a "full" Dedicated Overhead Block into a new Dedicated Overhead Block according to the SuperBlock Embodiment.

FIG. 21 illustrates the consolidation process according to the SuperBlock embodiment. For simplicity of illustration, the number of segments 2120, . . . , 2134 per page 2102 is depicted as eight segments, rather than the previous embodiment of one hundred twenty-eight segments. Similarly, for ease of illustration, the number of pages 2102, . . . , 2110 per Dedicated Overhead Block 2100 is depicted as five pages rather than the preferred sixteen or thirty-two pages. Because data has been stored in a segment 2142 of the final Super Overhead Field 2110 (which is also the final page) of the old Dedicated Overhead Block 2100, the block 2100 is regarded as "full" and all current segments 2120, 2122, 2136, 2138, 2140, 2142, 2132 and 2134 are consolidated into a new Dedicated Overhead Block 2170 as indicated by dotted lines. Because OV-4 2140 is the last Overhead Segment within the old Dedicated Overhead Block 2100 to receive overhead data, the previous Overhead Segment(s) 2128 within that same column have been obsoleted. The current segments 2120, 2122, 2136, 2138, 2140, 2142, 2132, 2134 shown circled are moved to the first Super Overhead Field (page zero) 2112 of the new Dedicated Overhead Block 2170. As noted, data being consolidated into a new Dedicated Overhead Block 2170 remains in the same respective column as the previous block 2100, the columns having been pre-correlated to the overhead data representing a particular VLBA. Because the first Super Overhead Field 2112 of a new Super Dedicated Overhead Block 2170 will typically be dedicated to receiving current segments in the consolidation process, the number of VLB overhead updates which can be stored in a Dedicated Overhead Block 2170 is typically one less than the number of Super Overhead Fields 2112, . . . , 2118 in a block 2170.

The present invention has been described in terms of specific embodiments incorporating many specific details offered to facilitate an understanding of the principles of construction and operation of the invention. The reference herein to specific embodiments and details thereof are not intended to limit the scope of the claims appended hereto. It will be apparent to those skilled in the art that modifications may be made to the embodiments chosen for illustration without departing from the spirit and scope of the invention.

What is claimed is:

1. A method of storing digital data within a Flash Memory System comprising the steps:
   a. mapping a non-volatile memory medium within the Flash Memory System into a plurality of independently addressable, independently programmable and independently erasable memory blocks including a plurality of Dedicated Data Blocks and a plurality of Dedicated Overhead Blocks comprising a first Dedicated Overhead Block and a second Dedicated Overhead Blocks;
   b. mapping each of the plurality of Dedicated Overhead Blocks into a plurality of pages, wherein the plurality of pages within each Dedicated Overhead Block are addressed according to an identical set of consecutive page addresses;
   c. mapping each of the plurality of Overhead Pages into a plurality of Overhead Segments, wherein the plurality of Overhead Segments within each page are addressed according to an identical set of consecutive segment addresses, each Overhead Segment comprising a plurality of registers including a Physical Address Register and a flag field; and
   d. correlating the plurality of consecutive Overhead Page addresses within the first Dedicated Overhead Block to a respective plurality of consecutive Virtual Logical Block Addresses including a first Logical Block Address defining a first Logical Block of User Data correlated to a first Overhead Page address defining a first Overhead Page.

2. The method according to claim 1 further comprising the steps:
   a. receiving from a host a first set of User Data defined according to the first Virtual Logical Block Address;
   b. storing the first set of User Data in a first Dedicated Data Block defined according to a first Virtual Physical Block Address;
   c. identifying a first available segment within the first page, an available Overhead Segment comprising an Overhead Segment that is unused, non-defective, and not obsolete, and wherein the first available segment is defined by a lowest segment address of available segments comprising the first page; and
   d. storing an address of the first Dedicated Data Block in the Physical Address Register of the first available Overhead Segment.

3. The method according to claim 1 wherein each of the Overhead Segments further comprises an error correction code.

4. The method according to claim 1 further comprising the step of consolidating all current Overhead Segments within the first Dedicated Overhead Block into a second Dedicated Overhead Block, a current Overhead Segment comprising an Overhead Segment that is used, non-defective, and not obsolete.

5. The method according to claim 4 wherein the step of consolidating the first Dedicated Overhead Block into a second Dedicated Overhead Block further comprises the steps:
   a. moving data stored within a current Overhead Segment within the first Overhead Page of the first Dedicated Overhead Block to a replacement Overhead Segment within a second Overhead Page within the second Dedicated Overhead Block, the replacement Overhead Segment being a lowest addressable segment within the second Overhead Page, the second Overhead Page being defined by an identical page address as an address defining the first Overhead Page; and
   b. erasing the first Dedicated Overhead Block.

6. The method according to claim 1 wherein the step of correlating the plurality of consecutive page addresses to a respective plurality of consecutive Virtual Logical Block Addresses is performed through a RAM space manager.

7. The method according to claim 6 further comprising the steps:
   a. storing a logical address within a non-volatile correlation register within the Flash Memory System; and
   b. loading a physical address into a correlation register of the RAM space manager upon power up.

8. The method according to claim 2 wherein the flag field within each Overhead Segment further includes a used flag, an obsolete flag, and a defective flag.

9. The method according to claim 8 wherein the step of identifying the first available segment further comprising the step of examining select flags within select Overhead Segments within the first page.

10. The method according to claim 9 wherein the step of storing an address of the first Dedicated Data Block in the Physical Address Register of the first available Overhead Segment further comprises the step of setting the used flag within the first available Overhead Segment to a second position, thereby indicating that overhead data has been stored therein.

11. The method according to claim 10 further wherein the step of storing an address of the first Dedicated Data Block in the Physical Address Register of the first available Overhead Segment further comprises the step of setting the obsolete flag in a last used Overhead Segment to a second position, thereby indicating the last used segment is obsolete; wherein the address of the first available segment consecutively follows an address defining the last used Overhead Segment within the first page.

12. The method according to claim 3 wherein the step of consolidation is preceded by a step of writing overhead data into a highest addressable overhead segment of a page within the first dedicated overhead block.

13. The method according to claim 1 further comprising the steps:
   a. marking as defective a dedicated overhead block; and
   b. re-designating a dedicated data block as a dedicated overhead block.

14. A method of data storage within a Flash Memory comprising the steps:
   a. mapping a non-volatile memory medium within the Flash Memory System into a plurality of independently addressable, independently programmable and independently erasable memory blocks including a plurality of Dedicated Data Blocks and a plurality of Dedicated Overhead Blocks comprising a first Dedicated Overhead Block and a second Dedicated Overhead Block;

b. mapping each of the plurality of Dedicated Overhead Blocks into a plurality of consecutively addressed Overhead Segments, wherein the plurality of segments within each Dedicated Overhead Block are addressed according to an identical set of distinct segment addresses, each segment comprising a Physical Address Register and a Flag Field;

c. correlating the first Dedicated Overhead Block to a first group of Virtual Logical Block Addresses including a first Virtual Logical Block Address;

d. receiving from a host a first set of User Data defined according to a first Virtual Logical Block Address;

e. identifying a first available Overhead Segment within the first Dedicated Overhead Block, the first available Overhead Segment comprising a lowest addressable available Overhead Segment within the first Dedicated Overhead Block, an available Overhead Segment comprising an Overhead Segment that is unused, non-defective, and not obsolete;

f. storing the first set of User Data in a first Dedicated Data Block defined according to a first Virtual Physical Block Address; and g. storing an address of the first Dedicated Data Block in the Physical Address Register of the first available Overhead Segment, wherein user data and overhead data are segregated in separate memory blocks, such that the user data are stored only in the plurality of dedicated data blocks and the overhead data are separately stored only in the plurality of dedicated overhead blocks.

15. The method according to claim 14 further comprising the step of consolidating all current Overhead Segments within the first Dedicated Overhead Block into consecutive Overhead Segments within the second Dedicated Overhead Block, a current Overhead Segment comprising an Overhead Segment that is used, non-defective, and not obsolete.

16. The method according to claim 15 wherein the step of consolidating the first Dedicated Overhead Block into a second Dedicated Overhead Block comprises the steps:

a. moving data stored within a first current Overhead Segment in the first Dedicated Overhead Block into a lowest addressable available Overhead Segment within the second Dedicated Overhead Block, and b. erasing the first Dedicated Overhead Block.

17. The method according to claim 16 wherein the step of consolidation is preceded by a step of writing overhead data into a last addressable segment of the first dedicated overhead block.

18. The method according to claim 16 wherein the step of moving data stored in a first current overhead segment into a first available overhead segment further comprises the steps:

a. examining select flags within select Overhead Segments comprising the first Dedicated Overhead Block, and b. examining select flags within select Overhead Segments comprising the second Dedicated Overhead Block.

19. The method according to claim 14 wherein the flag field within each Overhead Segment further includes a used flag, an obsolete flag, and a defective flag.

20. The method according to claim 19 further comprising the step of setting the used flag within the next available Overhead Segment to a second position, thereby indicating that overhead data has been stored in the next available segment.

21. The method according to claim 14 wherein the step of identifying the first available Overhead Segment further comprises the step of examining select flags within select Overhead Segments within the first Dedicated Overhead Block.

22. A method of storing digital data within a Flash Memory System comprising the steps:

a. mapping a non-volatile memory medium within the Flash Memory System into a plurality of separately addressable, separately programmable and separately erasable memory blocks comprising a plurality of Dedicated Data Blocks and a plurality of Dedicated Overhead Blocks, the plurality of Dedicated Overhead Blocks including a first Dedicated Overhead Block and a second Dedicated Overhead Block;

b. mapping each of the plurality of Dedicated Overhead Blocks into a fixed overhead field and a random overhead field, wherein the fixed overhead field of each of the plurality of Dedicated Overhead Blocks comprises a plurality of consecutively addressable Overhead Segments defined according to an identical sequence of Overhead Segment addresses, and a random overhead field comprises a plurality of consecutively addressable Overhead Segments, each Overhead Segment comprising a plurality of registers including a Physical Address Register; and c. correlating the plurality of consecutively addressable Overhead Segment within the fixed overhead field of the first Dedicated Overhead Block to a first group of consecutively addressable Virtual Logical Block Addresses including a first fixed segment correlated to a first Virtual Logical Block Address.

23. The method according to claim 22 further comprising the steps:

a. marking as defective a dedicated Overhead Block; and b. re-designating a Dedicated Data Block as a Dedicated Overhead Block.

24. The method according to claim 22 wherein the step of correlating the plurality of consecutively addressable Overhead Segments within the fixed overhead field of the Dedicated Overhead Block to a first group of consecutively addressable Virtual Logical Block Addresses is performed through a RAM Space Manager.

25. The method according to claim 24 further comprising the steps:

a. storing a logical address within a non-volatile correlation register within the Flash Memory System; and b. loading a physical address into a correlation register of the RAM Space Manager upon power up, thereby correlating a logical address with a physical address in the RAM Space Manager.

26. The method according to claim 22 further comprising the steps:

a. receiving from a host a first set of User Data defined according to the first Virtual Logical Block Address;

b. storing the first set of User Data in a first Dedicated Data Block defined according to a first Virtual Physical Block Address; and c. storing overhead data corresponding to the first Virtual Logical Block Address in the first Overhead Segment within the first Dedicated Overhead Block.

27. The method according to claim 26 wherein the step of storing overhead data in the first Overhead Segment comprises the steps:
 a. identifying the first fixed segment within the fixed overhead field of the first Dedicated Overhead Block;
 b. determining if the first fixed segment is available;
 c. storing the overhead data supporting the first Virtual Logical Block Address in the first fixed segment when the first fixed segment is available; and
 d. storing the overhead data corresponding to the first Virtual Logical Block Address in a first random Overhead Segment when the first fixed segment is not available, the first random segment comprising a lowest addressable unused and non-defective Overhead Segment within the random overhead field of the first Dedicated Overhead Block.

28. The method according to claim 26 wherein the step of determining that the first fixed segment is available comprises the step of examining flags within the first fixed segment.

29. The method according to claim 26 further comprising the steps:
 a. mapping the random overhead field of each Dedicated Overhead Block into a plurality of pages, each page comprising a plurality of segments;
 b. designating a lowest addressable segment in each page within the random overhead field as a Status Segment; and
 c. mapping each status segment into a plurality of registers to function as an update map.

30. The method according to claim 26 wherein the step of storing overhead data corresponding to the first Virtual Logical Block Address in the first random Overhead Segment further comprises the steps:
 a. locating a last previous segment used for storing overhead data supporting the first Virtual Logical Block Address;
 b. Setting an obsolete-flag corresponding to the last previous segment to a second value, indicating that overhead data within the last previous segment is now obsolete; and
 c. setting an used-flag in the first random Overhead Segment to a second value, indicating that overhead data is now stored in the first random Overhead Segment.

31. The method according to claim 22 further comprising the step of consolidating current overhead segments within the first Dedicated Overhead Block into the second Dedicated Overhead Block when the first Dedicated Overhead Block becomes full.

32. The method according to claim 31 wherein the step of consolidating current overhead segments comprises the steps:
 a. correlating a second Overhead Segment within the fixed overhead field of the second Dedicated Overhead Block to the first Virtual Logical Block Address; and
 b. copying data within the first overhead segment into the second overhead segment.

33. The method according to claim 29 wherein the update map contains one register corresponding to each segment within the fixed overhead field of the first Dedicated Overhead Block.

34. A method of storing digital data within a Flash Memory System comprising the steps:
 a. mapping a non-volatile memory medium within the Flash Memory System into a plurality of separately addressable, separately programmable and separately erasable memory blocks comprising a plurality of Dedicated Data Blocks and a plurality of Dedicated Overhead Blocks, the plurality of Dedicated Overhead Blocks including a first Dedicated Overhead Block and a second Dedicated Overhead Block;
 b. mapping each of the plurality of Dedicated Overhead Blocks into plurality of Super Overhead Fields, including a first Super Overhead Field within the first Dedicated Overhead Block;
 c. mapping each of the plurality of Super Overhead Fields into an identical set of consecutively addressable Overhead Segments, each of the plurality of Overhead Segments comprising a plurality of registers including a Physical Address Register;
 d. correlating a first Super Virtual Logical Block Address defined by consecutive Virtual Logical Block Addresses to the first Dedicated Overhead Block; and
 e. correlating a first Virtual Logical Block Address within the first Super Virtual Logical Block Address to a first Overhead Segment Address within the first Dedicated Overhead Block.

35. The method according to claim 34 further comprising the steps:
 a. marking as defective a dedicated Overhead Block; and
 b. re-designating a Dedicated Data Block as a Dedicated Overhead Block.

36. The method according to claim 34 wherein the step of correlating a first Super Virtual Logical Block Address to the first Dedicated Overhead Block is performed through a RAM Space Manager.

37. The method according to claim 36 further comprising the steps:
 a. storing a logical address within a non-volatile correlation register within the Flash Memory System; and
 b. loading a physical address into a correlation register of the RAM Space Manager upon power up, thereby correlating a logical address with a physical address in the RAM Space Manager.

38. The method according to claim 37 wherein the non-volatile correlation register is within an extension field of a Super Overhead Field of a Dedicated Overhead Block.

39. The method according to claim 34 further comprising the steps:
 a. receiving from a host a first set of User Data defined according to the first Virtual Logical Block Address;
 b. storing the first set of User Data in a first Dedicated Data Block defined according to a first Virtual Physical Block Address;
 c. storing overhead data corresponding to the first Virtual Logical Block Address in a first Overhead Segment defined by the first Overhead Segment Address within the first Super Overhead Field.

40. The method according to claim 39 wherein the step of storing overhead data is preceded by the step of incrementing from a previous Super Overhead Field within the first Dedicated Overhead Block to the first Super Overhead Field.

41. The method according to claim 39 wherein the step of storing overhead data further comprises the step of setting an used-flag within the first Overhead Segment to a second position indicating that overhead data is stored within the first Overhead Segment.

42. The method according to claim 41 wherein the step of storing overhead data further comprises the steps:
 a. locating a last previous segment within the first Dedicated Overhead Block used for storing overhead data supporting the first Virtual Logical Block Address; and b. setting an obsolete-flag within the last previous segment to a second value, indicating that overhead data within the last previous segment is now obsolete.

43. The method according to claim 34 further comprising the step of consolidating current overhead segments within the first Dedicated Overhead Block into the second Dedicated Overhead Block when overhead data has been stored in a final Super Overhead Field within the first Dedicated Overhead Block.

44. The method according to claim 43 wherein the step of consolidating current overhead segments comprises the steps:
   a. identifying a first current Overhead Segment defined according to the first Overhead Segment Address within the first Dedicated Overhead Block; and
   b. copying data within the first current Overhead Segment into a second overhead segment defined according to the first Overhead Segment Address within the first Super Overhead Field of the second Dedicated Overhead Block.

45. A flash memory device for storing User Data comprising a plurality of separate, independently addressable, independently programmable and independently erasable non-volatile Physical Memory Blocks distinguishably defined by a plurality of Physical Block Addresses including:
   a. a plurality of dedicated data Blocks for storing User Data only; and
   b. a plurality of consecutively addressed Dedicated Overhead Blocks for storing Overhead Data only including a first Dedicated Overhead Block and a second Dedicated Overhead Block,
wherein the plurality of dedicated data blocks is segregated from the plurality of dedicated overhead blocks, wherein each Dedicated Overhead Block is identically comprised of a plurality of separately addressable Overhead Pages, each block following an identical sequence of page addresses, wherein each Overhead Page is comprised of a plurality of independently addressable and independently programmable segments, including a plurality of Overhead Segments, wherein the plurality of independent Overhead Segments are used for storing Overhead Data, each Overhead Segment supporting one Virtual Logical Block of User Data, each Overhead Segment comprising:
   a. physical Address Register for storing a Physical Address for locating corresponding User Data; and
   b. a flag field,
wherein a first group of Virtual Logical Block Addresses including a first VLBA are assigned to the first Dedicated Overhead Block, such that overhead data generated in support of the first VLBA will be stored in an Overhead Segment within the first Dedicated Overhead Block, wherein sequential VLBA's within the first group of VLBA's are respectively correlated to sequentially addressed Overhead Page Addresses within the first Dedicated Overhead Block, including a first Virtual Logical Block Address correlated to a first Overhead Page within the first Dedicated Overhead Block, such that Overhead Data supporting the first Virtual Logical Block Address will be stored in an Overhead Segment within the first Overhead Page.

46. A Flash Memory Device for storing User Data comprising a plurality of separate, independently addressable, independently programmable and independently erasable non-volatile Physical Memory Blocks distinguishably defined by a plurality of Physical Block Addresses including:
   a. a plurality of dedicated data Blocks for storing User Data only; and
   b. a plurality of consecutively addressed Dedicated Overhead Blocks for storing Overhead Data only including a first Dedicated Overhead Block and a second Dedicated Overhead Block,
wherein the plurality of dedicated data blocks is segregated from the plurality of dedicated overhead blocks, wherein each Dedicated Overhead Block is identically comprised of a plurality of separately addressable Overhead Pages, each block following an identical sequence of page addresses, wherein each Overhead Page is comprised of a plurality of independently addressable and independently programmable segments, including a plurality of Overhead Segments, wherein the plurality of independent Overhead Segments are used for storing Overhead Data, each Overhead Segment supporting one Virtual Logical Block of User Data, each Overhead Segment comprising:
   a. physical Address Register for storing a Physical Address for locating corresponding User Data; and
   b. a flag field,
wherein a first group of Virtual Logical Block Addresses including a first VLBA are assigned to the first Dedicated Overhead Block, such that overhead data generated in support of the first VLBA will be stored in an Overhead Segment within the first Dedicated Overhead Block, wherein each of the plurality of Dedicated Overhead Blocks further comprise of a fixed Overhead Field and a Random Overhead Field, the fixed Overhead Field being comprised of a plurality of consecutively addressed Overhead Pages, and the Random Overhead Field being comprised of a plurality of consecutively addressed Overhead Pages.

47. The Flash Memory Device according to claim 46 wherein consecutively addressed segments comprising the consecutively addressable Overhead Pages within the Fixed Overhead Field of the first Dedicated Overhead Block are respectively correlated to sequentially addressed Virtual Logical Block Addresses.

48. The flash memory device according to claim 47 wherein the plurality of consecutively addressed segments comprising the consecutively addressed Overhead Pages within a first Overhead Page within the Random Overhead Field of the First Dedicated Overhead Block comprise a Status Segment and a plurality of Overhead Segments, the Status Segment defined according to a lowest segment address among the plurality of segments within the first Overhead Page.

49. A Flash Memory Device for storing User Data comprising a plurality of separate, independently addressable, independently programmable and independently erasable non-volatile Physical Memory Blocks distinguishably defined by a plurality of Physical Block Addresses including:
   a. a plurality of dedicated data Blocks for storing User Data only; and
   b. a plurality of consecutively addressed Dedicated Overhead Blocks for storing Overhead Data only including a first Dedicated Overhead Block and a second Dedicated Overhead Block,
wherein the plurality of dedicated data blocks is segregated from the plurality of dedicated overhead blocks, wherein each Dedicated Overhead Block is identically comprised of a plurality of separately addressable Overhead Pages, each block following an identical sequence of page addresses, wherein each Overhead Page is comprised of a plurality of independently addressable and independently programmable segments, including a plurality of Overhead Segments, wherein the plurality of independent Overhead Segments are used for storing Overhead Data, each Overhead Segment supporting one Virtual Logical Block of User Data, each Overhead Segment comprising:

a. physical Address Register for storing a Physical Address for locating corresponding User Data; and b. a flag field, wherein a first group of Virtual Logical Block Addresses including a first VLBA are assigned to the first Dedicated Overhead Block, such that overhead data generated in support of the first VLBA will be stored in an Overhead Segment within the first Dedicated Overhead Block, wherein each Dedicated Overhead Block is further comprised of a plurality of Super Overhead Fields including a first Super Overhead Field, a Super Overhead Field comprised of a whole number of pages, each Super Overhead Field within the first Dedicated Overhead Block comprised of an identical number of pages, wherein consecutive Overhead Segments within first Super Overhead Region are respectively assigned to consecutively addressed Virtual Logical Block Addresses which comprise a first SuperBlock.

* * * * *

UNITED STATES PATENT AND TRADEMARK OFFICE
CERTIFICATE OF CORRECTION

| | | |
|---|---|---|
| PATENT NO. | : 7,155,559 B2 | Page 1 of 1 |
| APPLICATION NO. | : 09/648271 | |
| DATED | : December 26, 2006 | |
| INVENTOR(S) | : Petro Estakhri and Siamack Nemazie | |

It is certified that error appears in the above-identified patent and that said Letters Patent is hereby corrected as shown below:

ON TITLE PAGE ITEM 56
<u>IN THE REFERENCES CITED - FOREIGN PATENT DOCUMENTS</u> add -- France Patent Number 05-233246 --.

add -- Japan Patent Number 63-155248 --.

<u>IN THE SPECIFICATION - BACKGROUND OF THE INVENTION</u>

Col. 5, line 58, replace "FRAM cells" with --DRAM cells --.

Col. 6, line 41, replace "LBS's" with -- LEA's --.

Col. 7, line 49, replace "VLBA Register 460" with -- VLBA Register 360 --.

Signed and Sealed this

Twentieth Day of March, 2007

JON W. DUDAS
*Director of the United States Patent and Trademark Office*